US 11,705,926 B2

(12) United States Patent
Hong et al.

(10) Patent No.: US 11,705,926 B2
(45) Date of Patent: *Jul. 18, 2023

(54) REDUCED COMPLEXITY POLAR ENCODING AND DECODING

(71) Applicant: InterDigital Patent Holdings, Inc., Wilmington, DE (US)

(72) Inventors: Sungkwon Hong, Dongjak-gu (KR); Onur Sahin, London (GB)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/946,200

(22) Filed: Sep. 16, 2022

(65) Prior Publication Data

US 2023/0022938 A1   Jan. 26, 2023

Related U.S. Application Data

(63) Continuation of application No. 17/040,131, filed as application No. PCT/US2019/023302 on Mar. 21, 2019, now Pat. No. 11,476,875.

(Continued)

(51) Int. Cl.
*H03M 13/00* (2006.01)
*H03M 13/13* (2006.01)

(52) U.S. Cl.
CPC ....... *H03M 13/6502* (2013.01); *H03M 13/13* (2013.01)

(58) Field of Classification Search
CPC .......................... H03M 13/13; H03M 13/6502
See application file for complete search history.

(56) References Cited

U.S. PATENT DOCUMENTS

2015/0026543 A1   1/2015   Li et al.
2015/0349909 A1*  12/2015  El-Khamy ........ H04W 72/0466
                                                          370/335

(Continued)

FOREIGN PATENT DOCUMENTS

WO        2018192640 A1    10/2018

OTHER PUBLICATIONS

M. El-Khamy, H. Mahdavifar, G. Feygin, J. Lee and I. Kang, "Relaxed channel polarization for reduced complexity polar coding," 2015 IEEE Wireless Communications and Networking Conference (WCNC), New Orleans, LA, USA, 2015, pp. 207-212, doi: 10.1109/WCNC.2015.7127470. (Year: 2015).*

(Continued)

*Primary Examiner* — Albert Decady
*Assistant Examiner* — Enamul M Kabir
(74) *Attorney, Agent, or Firm* — Condo Roccia Koptiw LLP

(57) ABSTRACT

Systems, methods, and instrumentalities are described herein that may be used for reduced complexity polar encoding and decoding. There may be a set of encoding nodes to be used for polar encoding. An encoding node may be associated with a bit index and/or a relaxation level. A relaxation attribute may be selected for the encoding node. A relaxation group may be determined based on the relaxation attributes. The relaxation group may include two encoding nodes associated with consecutive bit indexes, an initial relaxation level, and the first relaxation attribute. A final relaxation level may be determined. Relaxation may be performed on the encoding nodes in the relaxation group. For example, an XOR operation between the encoding nodes may be omitted. Relaxation may be performed on the encoding nodes associated with each relaxation level up to the final relaxation level.

20 Claims, 21 Drawing Sheets

Related U.S. Application Data

(60) Provisional application No. 62/646,480, filed on Mar. 22, 2018.

(56) References Cited

U.S. PATENT DOCUMENTS

| | | | |
|---|---|---|---|
| 2016/0254876 A1 | 9/2016 | Shen et al. | |
| 2016/0308643 A1 | 10/2016 | Li et al. | |
| 2017/0288703 A1 | 10/2017 | Shen et al. | |
| 2018/0145702 A1* | 5/2018 | Feygin | H03M 13/00 |
| 2018/0226999 A1 | 8/2018 | Wang et al. | |
| 2018/0227076 A1* | 8/2018 | Koike-Akino | H04L 1/0009 |
| 2019/0036550 A1* | 1/2019 | Koike-Akino | H03M 13/2771 |

OTHER PUBLICATIONS

M. El-Khamy, H. Mahdavifar, G. Feygin, J. Lee and I. Kang, "Relaxed Polar Codes," in IEEE Transactions on Information Theory, vol. 63, No. 4, pp. 1986-2000, Apr. 2017, doi: 10.1109/TIT.2017.2657691. (Year: 2017).*

K. M. Prakash and G. S. Sunitha, "Complexity reduction scheme in encoding and decoding for polar codes," 2016 IEEE International Conference on Recent Trends in Electronics, Information & Communication Technology (RTEICT), Bangalore, India, 2016, pp. 1558-1562, doi: 10.1109/RTEICT.2016.7808094. (Year: 2016).*

Arikan, Erdal, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

El-Khamy, et al., "Relaxed Channel Polarization for Reduced Complexity Polar Coding", 2015 IEEE Wireless Communications and Networking Conference (WCNC), IEEE, Mar. 9, 2015, 6 pages.

El-Khamy, et al., "Relaxed Polar Codes", IEEE Transactions on Information Theory, vol. 63, No. 4, Apr. 2017, pp. 1-14.

El-Khamy, et al., "Relaxed Polar Codes", arXiv:1501.06091v2, Jul. 16, 2015, pp. 1-14.

Hong, et al., "A Simple Relaxation Scheme for Polar Codes", IEEE International Conference on Information and Communication Technology Convergence (ICTC), Oct. 17, 2018, pp. 74-78.

Koike-Akino, et al., "Irregular Polar Coding for Complexity-Constrained Lightwave Systems", IEEE Journal of Lightwave Technology, vol. 36, No. 11, Jun. 1, 2018, pp. 2248-2258.

Koike-Akino, et al., "Irregular Polar Coding for Multi-Level Modulation in Complexity-Constrained Lightwave Systems", 2017 European Conference on Optical Communication (ECOC), IEEE, Sep. 17, 2017, 3 pages.

Niu, et al., "CRC-Aided Decoding of Polar Codes", IEEE Communications Letters, vol. 16, No. 10, Oct. 2012, pp. 1668-1671.

Saber, et al., "An Incremental Redundancy Hybrid ARQ Scheme Via Puncturing and Extending of Polar Codes", IEEE Transactions on Communications, vol. 63, No. 11, Nov. 2015, pp. 1-10.

Tal, et al., "How to Construct Polar Codes", IEEE Transactions on Information Theory, vol. 59, No. 10, Oct. 2013, pp. 6562-6582.

Tal, et al., "List Decoding of Polar Codes", arXiv:1206.0050v1, May 31, 2012, pp. 1-11.

Trifonov, Peter, "Efficient Design and Decoding of Polar Codes", IEEE Transactions on Communications, vol. 60, No. 11, Nov. 2012, pp. 3221-3227.

TS 38.212 V15.0.0, , "3rd Generation Partnership Project (3GPP)", Technical Specification Group Radio Access Network, NR, Multiplexing and Channel Coding (Release 15), Dec. 2017, pp. 1-82.

Vangala, et al., "A Comparative Study of Polar Code Constructions for the AWGN Channel", arXiv:1501.02473v1, Jan. 11, 2015, pp. 1-9.

Venkatesh, T. et al., "High Speed and Low Complexity XOR-Free Technique Based Data Encoder Architecture", 2017 International Conference on Innovations in Information, Embedded and Communication Systems (ICIIECS), 2017, 4 pages.

Wang, et al., "A Novel Puncturing Scheme for Polar Codes", IEEE Communications Letters, vol. 18, No. 12, Dec. 2014, pp. 2081-2084.

\* cited by examiner

US 11,705,926 B2

REDUCED COMPLEXITY POLAR ENCODING AND DECODING

CROSS-REFERENCE TO RELATED APPLICATIONS

This application is a continuation of U.S. patent application Ser. No. 17/040,131 (now U.S. Pat. No. 11,476,875), which is the National Stage Entry under 35 U.S.C. § 371 of Patent Cooperation Treaty Application No. PCT/US2019/023302, filed Mar. 21, 2019, which claims the benefit of U.S. Provisional Application Ser. No. 62/646,480, filed Mar. 22, 2018, the contents of each of which are incorporated by reference herein in their entireties.

BACKGROUND

Mobile communications using wireless communication continue to evolve. A fifth generation may be referred to as 5G. A previous (legacy) generation of mobile communication may be, for example, fourth generation (4G) long term evolution (LTE).

SUMMARY

Systems, methods, and instrumentalities are described herein that may be used for reduced complexity polar encoding and decoding. A wireless transmit/receive unit may perform polar encoding, which may include relaxation. There may be a set of encoding nodes to be used for polar encoding. An encoding node may be associated with a bit index and/or a relaxation level. A relaxation attribute may be selected for the encoding node (e.g., each encoding node in the set) based on the bit index. For example, a first relaxation attribute may be selected for each encoding node associated with a bit index that is included in a set of most reliable bit indexes or a set of least reliable bit indexes. A second relaxation attribute may be selected for each encoding node associated with a bit index that is not included in the set of most reliable bit indexes or the set of least reliable bit indexes.

A relaxation group may be determined based on the relaxation attributes. For example, the relaxation group may include two encoding nodes associated with an initial relaxation level (e.g., level 0) and the first relaxation attribute. The encoding nodes in the relaxation group may be associated with consecutive bit indexes. For example, the encoding nodes may be associated with bit indexes 3 and 4. A final relaxation level may be determined. The final relaxation level may be a relaxation level after which no relaxation is performed. Encoding may be performed on the encoding nodes (e.g., all the encoding nodes) associated with the initial relaxation level. Relaxation may be performed on the encoding nodes in the relaxation group. For example, an XOR operation between the encoding nodes may be omitted. Relaxation attributes may be determined for encoding nodes associated with a next relaxation level (e.g., level 1). The relaxation attribute for an encoding node associated with the next relaxation level may be based on the relaxation attribute for the encoding node associated with the initial relaxation level and the same bit index. For example, the relaxation attribute for an encoding node associated with a bit index of 3 and a relaxation level of 1 may be based on the relaxation attribute for an encoding node associated with a bit index of 3 and a relaxation level of 0. Encoding may be performed on the encoding nodes associated each relaxation level (e.g., sequentially). Relaxation may be performed on the encoding nodes associated with each relaxation level up to the final relaxation level.

A plurality of initial relaxation attributes may be selected. The relaxation attributes may be grouped into a plurality of relaxation groups. A maximum number of relaxation levels for each of the plurality of relaxation groups may be determined. The relaxation attribute for each of the relaxation levels of each of the plurality of relaxation groups may be determined. An encoding operation may be performed on each of the relaxation levels of each of the plurality of relaxation groups. The encoding operation may be based on the determined relaxation attribute.

Selecting and including a set of component codes of a parent polar code may be performed (e.g., by relaxation) to reduce the complexity of polar encoding and decoding operations. Initial bit channel indices that may participate in relaxation may be identified, e.g. depending on parameters such as bit channel reliability order and desired complexity reduction value. Bit index groups that may participate in relaxation may be calculated. A final encoding level in an encoder where relaxation may be terminated may be determined.

Adaptive polar component code selection and signaling, e.g. utilizing parameters such as desired encoder and decoder complexity reduction value, may be performed. A transmitter may inform a receiver regarding information that may be employed in encoder and decoder complexity reduction, or vice versa.

Polar encoding, e.g., based on the selected encoder nodes and complexity reduction (e.g., relaxation) may be employed. Polar decoding, e.g., based on the selected encoding nodes and their analogous operations in decoding and complexity reduction (e.g., relaxation) may be employed. Bhattacharyya code construction based polar encoder relaxation may be performed.

BRIEF DESCRIPTION OF THE DRAWINGS

Furthermore, like reference numerals in the figures indicate like elements, and wherein.

DETAILED DESCRIPTION

Figure 1A:
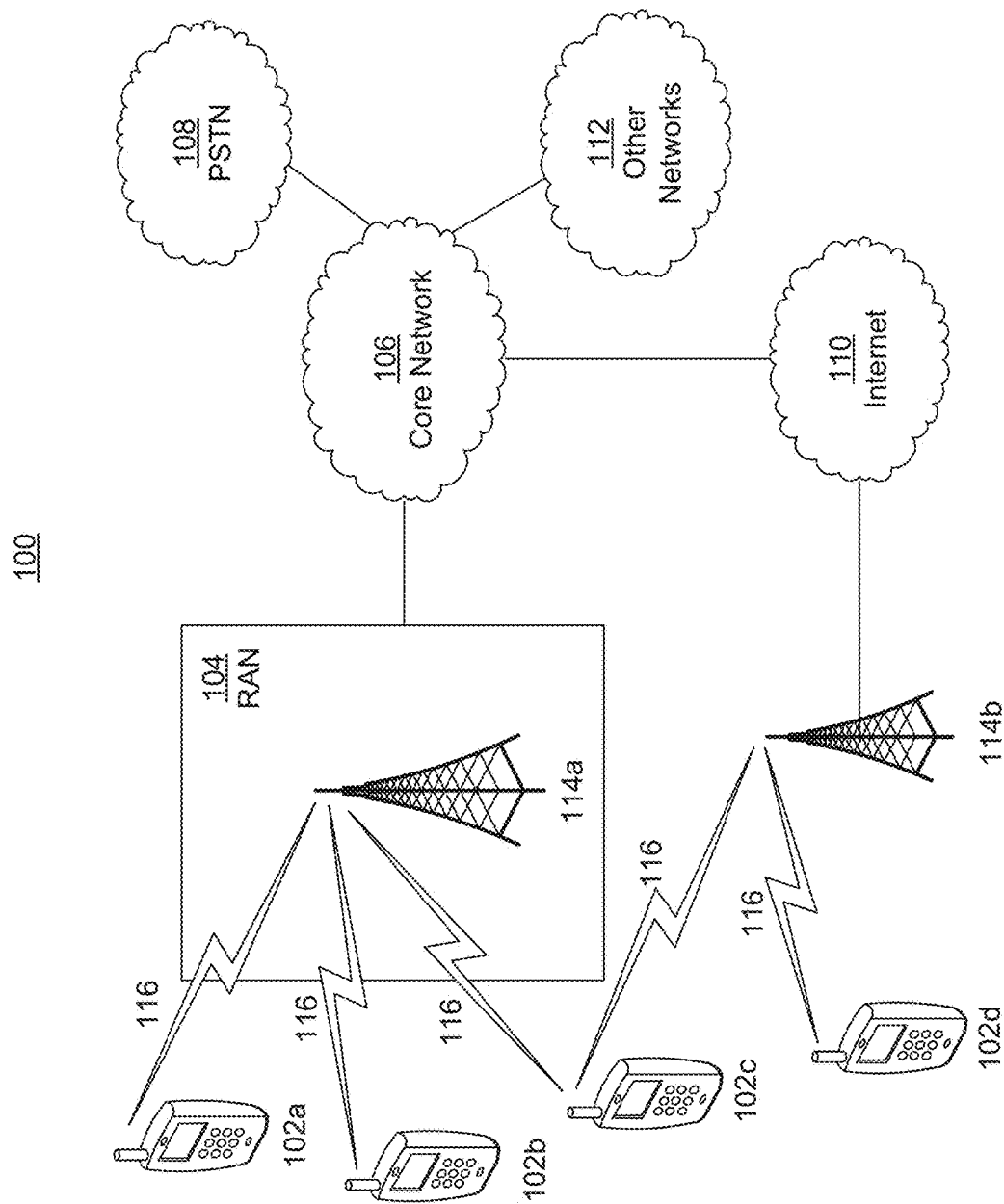
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
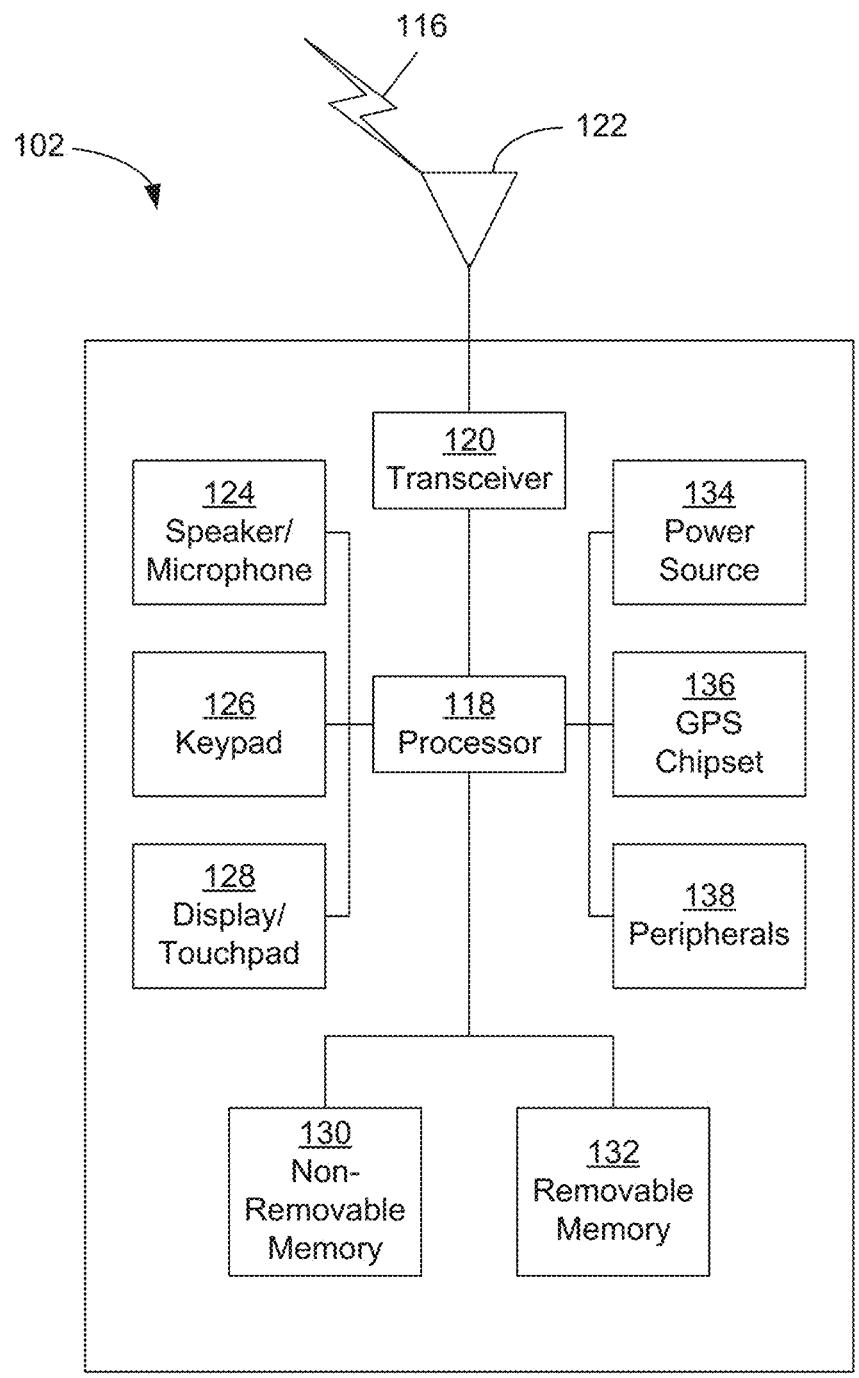
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 1C:
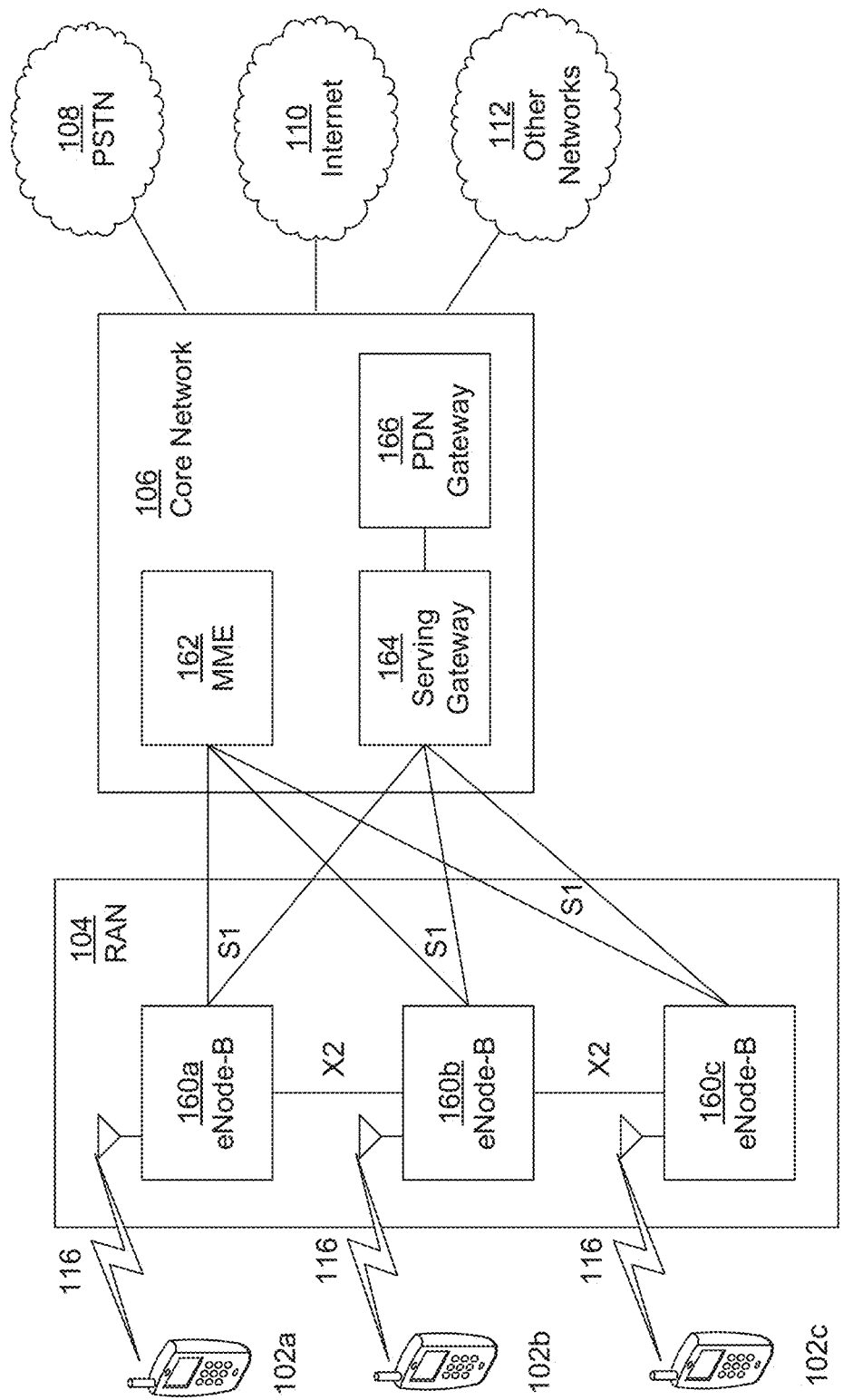
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
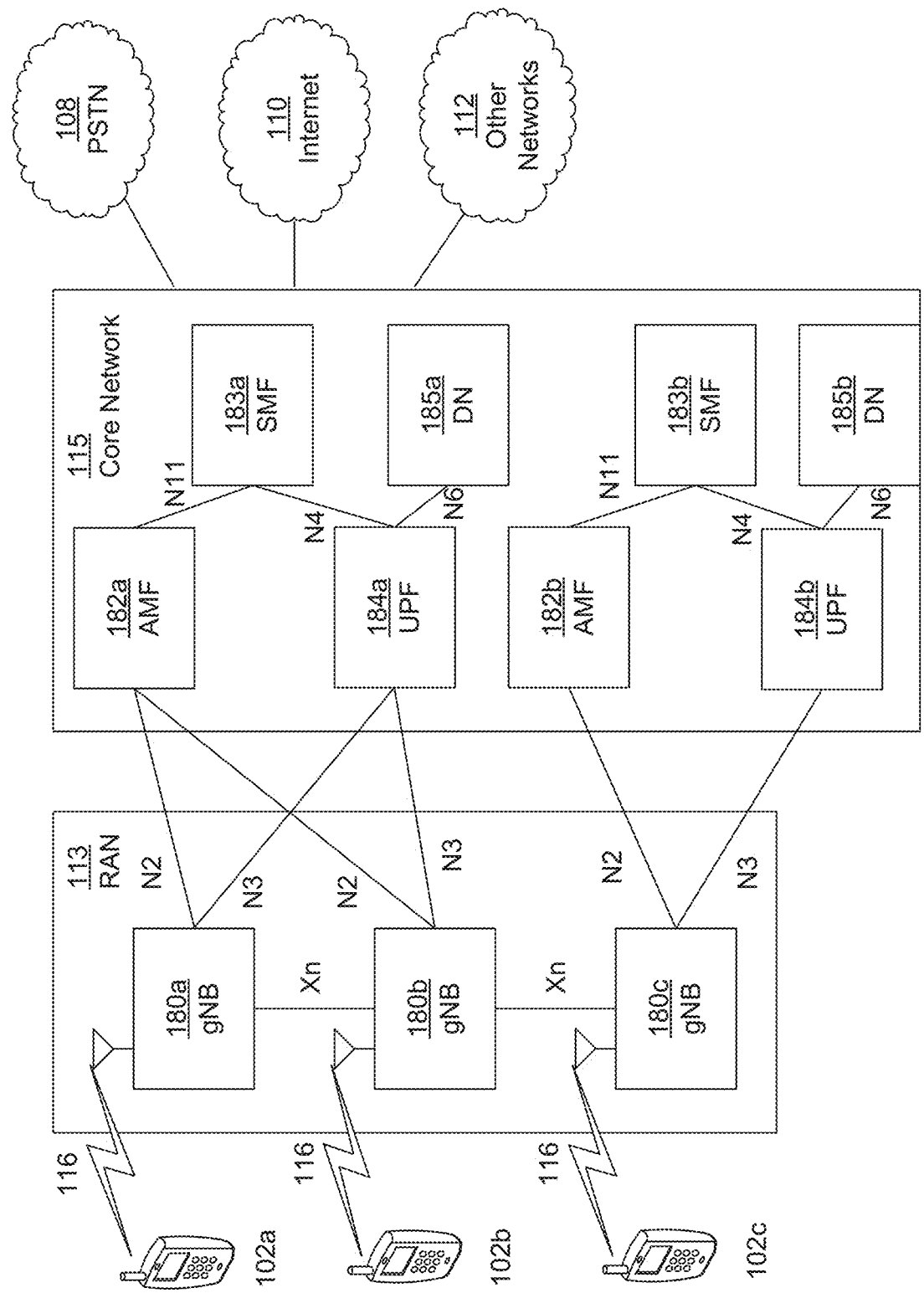
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a,184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Polar codes may have significant potential in achieving high throughput under practical constraints of energy efficiency, power density, and flexibility. An approach to enable higher throughputs may be to reduce the complexity of encoding and decoding operations while preserving the error-correction performance. Such a reduction in complexity may allow encoding and decoding operations to operate within practical constraints including, for example, energy efficiency, power density, and/or flexibility.

Implementation(s) associated with reducing the encoding and decoding complexity and/or latency of polar codes, which may preserve or improve error-correction performance, may be disclosed herein. Disclosed implementation(s) may facilitate higher throughputs within the practicality constraints of interest.

Polar codes may be used in wireless communication systems. Polar codes may be used as capacity achieving codes. Polar codes may show comparable performance to other codes (e.g., low-density parity-check (LDPC) code or turbo code) and may have a low error floor when aided by an embedded CRC, e.g. particularly for small to medium block lengths. Polar codes with successive cancellation decoding may require relatively low encoding and decoding complexities. The decoding complexity may increase in proportion to a list size, e.g. when CRC-aided list decoding is adopted. Decoding complexity may increase in proportion to the block-length of the codeword. The complexity increase may become an issue, e.g. for medium to large block-lengths, and may limit the adaptation of polar codes for a high throughput regime, e.g. including 5G NR eMBB data rates (~20 Gbps) and above.

Polar codes may be used as a channel coding scheme for 3GPP NR, e.g., to be used in control channel FEC operations, and may have better performance for small block lengths.

Polar code encoding may be as in Equation 1:

$$c_1^N = u_1^N G_N.\qquad\text{Equation 1}$$

A codeword vector of polar code, which may be denoted as $c_1^N$, may be generated by the product of an input vector, which may be denoted as $u_1^N$, and a generator matrix, which may be denoted as $G_N$. $c_1^N$ and $u_1^N$ may be binary vectors with length $N=2^n$, where N may denote the codeword block length. The generator matrix $G_N$ may be defined by the Kronecker power of $$F = \begin{bmatrix} 1 & 0 \\ 1 & 1 \end{bmatrix},\qquad\text{Equation 2}$$

$$G_N = F^{\otimes n}$$

where $()^{\otimes n}$ may stand for the n-th Kronecker power of ( ). In certain situations, $G_N$ may be equal to $B_N F^{\otimes n}$. $B_N$ may denote a bit reversing matrix, and it may change the order of elements in $u_1^N = [u_1, u_2, \ldots, u_N]$. It may be assumed that $G_N = F^{\otimes n}$, e.g., unless stated otherwise.

Some input bits for polar encoding may have a fixed value (e.g., zero) and may be referred to as "frozen bits." The input indexes for frozen bits may be represented by the set $A^c$.

The remaining input bits for polar encoding may convey variable information bits and may be referred to as "unfrozen bits." The input indexes for unfrozen bits may be represented by the set A.

The number of information bits (e.g., unfrozen bits) may be defined as K and the number of frozen bits may be N–K.

The code rate R of polar code may be defined as K/N.

Determination of input bit indexes for frozen bits and unfrozen bits may be referred to as "code construction" (e.g., for polar encoding).

Figure 2:
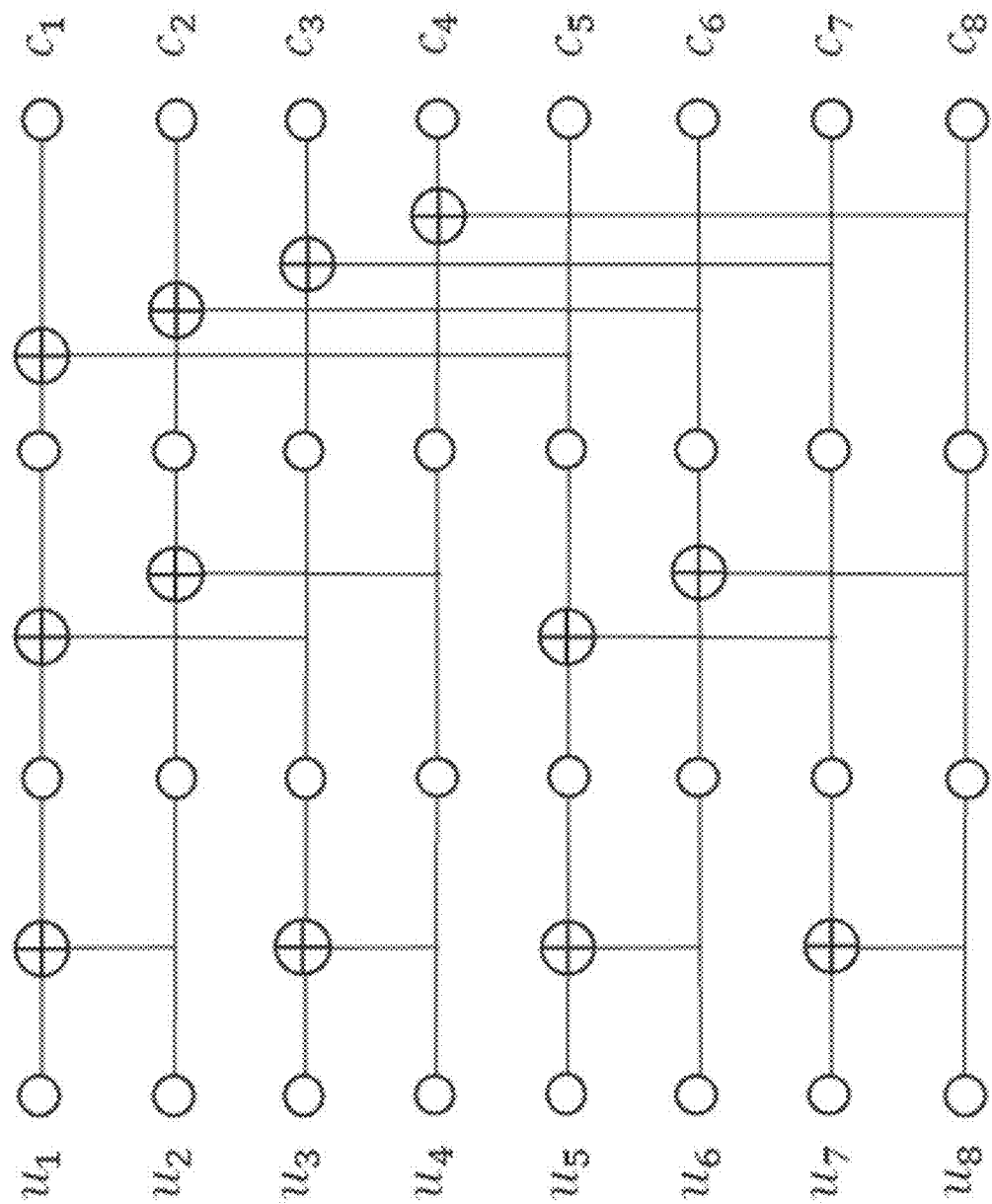
FIG. 2 shows an example polar encoder where a codeword block length may be equal to 8.

There may be several code construction implementations for polar encoding. In general, the implementations may initially calculate the reliability of input bit indexes (e.g., each input bit index), and therefore may have an order of bit index reliabilities before starting the encoding operation. From the obtained reliability order, the least reliable input bits may be assigned as frozen bits and the remaining bits may be assigned as unfrozen/information bits. The proportion of frozen and unfrozen bits may be determined according to a desired code rate. With the frozen and unfrozen bit locations available, the encoding operation may continue as in Equation 1 shown in FIG. 2. FIG. 2 shows an example polar encoder where a codeword block length may be equal to 8.

Decoding of polar code may be categorized into one or more (e.g., two) implementations, for example Successive Cancellation (SC) based decoding and Belief Propagation (BP) based decoding.

SC polar decoding may use sequential decoding to calculate a log-likelihood ratio (LLR) value of input bits in a serial manner. SC polar decoding may be based on the assumption that the previously decoded bits are correct. The previously decoded bits may be used for decoding the current bit.

Successive Cancellation List (SCL) decoding may adopt several lists of candidate paths to improve the performance of SC decoding. A list (e.g., the best list) may be selected according to the outcome of the LLR calculation. CRC Aided Successive Cancellation List (CA-SCL) decoding may adopt embedded CRC as a tool to select the list. By CA-SCL decoding, polar code may achieve error performance comparable or superior to other codes, e.g. LDPC code or turbo code.

In a representation that may be denoted as a Tanner graph representation of polar code, polar code may be decoded by message passing according to the sum product implementation or min sum implementation.

Figure 3:
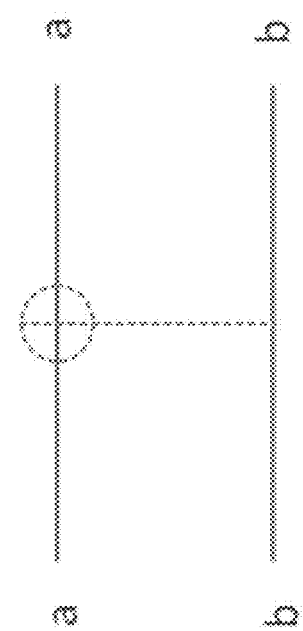
FIG. 3 shows an example relaxation operation.
Figure 3:
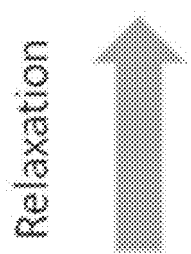
Figure 3:
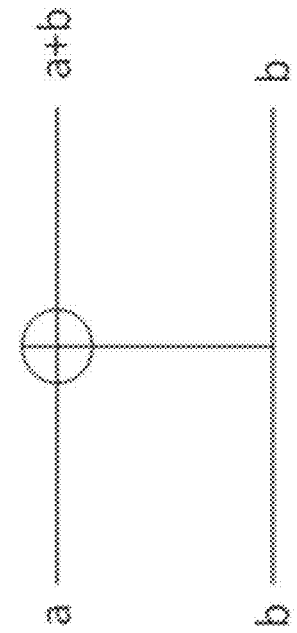

One approach that may be used in reducing the complexity of encoding and decoding operations of polar codes is relaxation. Relaxation of polar code may mean that parts of a polarization implementation in polar code are omitted. The polarization implementation may correspond to an XOR operation in polar encoding. Relaxation may be done by omitting the XOR operation, e.g., in some parts of polar encoding. FIG. 3 shows an example relaxation operation.

A corresponding decoding XOR operation may not be performed (e.g., in the decoding of relaxed polar code). This may provide decoding complexity reduction. It may be that one or more decoding implementations developed for polar decoding, e.g. including SC, SCL, CASCL and BP decoding, may be used equivalently with reduced decoding complexity.

The relaxation scheme (e.g., including irregular polar code as described herein) may provide the reduction of complexity and latency in encoding and decoding in addition to performance improvement with proper selection of relaxed nodes.

A graph representation of polar code may be described herein.

Polar codes may be well structured, e.g., in terms of encoding and decoding. The design of a polar code may depend on the mapping of K information bits to $N(=2^n)$ input bits of a polar encoder $u_1^N$. The K information bits may be put on the K best bit channels. The remaining N−K input bits (e.g., those which are not mapped from the information bits) may be called frozen bits, and may be generally set as 0. The set of the positions for frozen bits may be called frozen set $A^c$.

Figure 4:
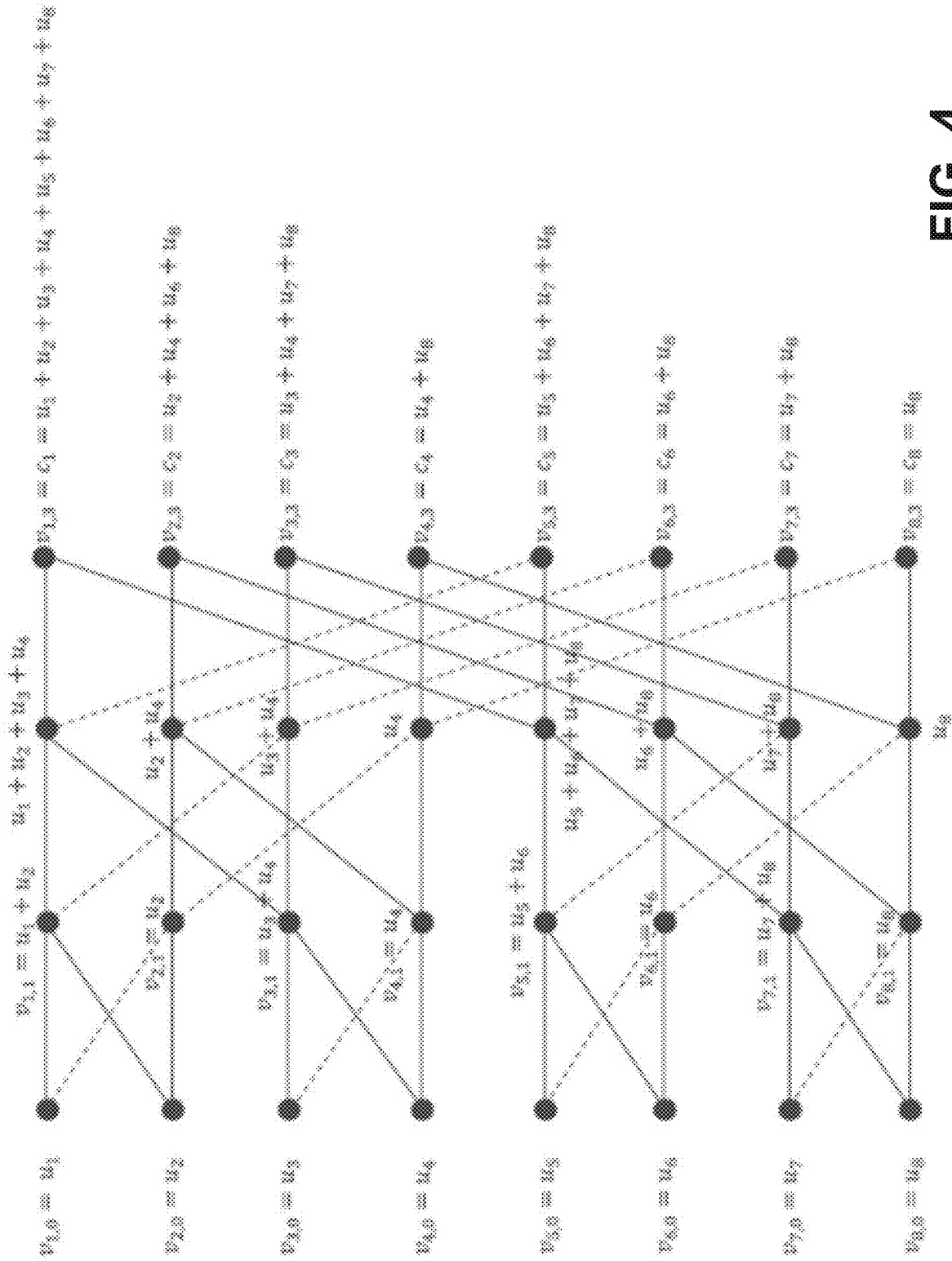
FIG. 4 shows an example graph of polar code.

Polar code encoding and decoding may be described by a graph representation, e.g. as shown in FIG. 4. FIG. 4 shows a polar code graph where a codeword block length may be equal to 8. As shown in FIG. 4, a polar code graph may consist of (n+1)N nodes. Nodes (e.g., each node) may be indexed by (i,j), where i=1, 2, ..., N, j=0, 1, ..., n. i may indicate a row index and j may indicate a column index. The rows may be numbered from top to bottom, and the columns may be numbered from left to right. Numbering of the columns may start with zero (e.g., rather than one). The left most nodes (i, 0) may indicate input bits of polar code $u_i$, where i=1, 2, ..., N. The right most node (i,n) may indicate the output coded bits $c_i$, where i=1, 2, ..., N. $v_{i,j}$ may be defined as the value of node (i,j), with $v_{i,0}=u^i$ and $v_{i,n}=c_i$. The column index j may also be defined as the jth level.

In FIG. 4, the relation of the connection between level j and level j+1 may be as shown and node (i,j) may be connected with (i,j+1). For example, $v_{1,0}$ and $v_{2,0}$ may have a connection (e.g., a link) with $v_{1,1}$ and $v_{2,1}$ respectively. $v_{1,1}$ and $v_{2,1}$ may have a connection (e.g., a link) with $v_{1,2}$ and $v_{2,2}$. The connection (e.g., link) may be extended from level 0 to level n. A bit reversing interleaver may be applied and the connected nodes between subsequent two levels may have a different indexes.

Two nodes involved in a polarization operation may be defined as "paired." In FIG. 3, a and b may be paired, e.g. before relaxation. As shown in FIG. 4, node (1,0) may be paired with node (2,0) and node (1,1) may be paired with node (3,1).

In polar encoding, the input bits may be transferred to n level and may experience polarization at some levels (e.g., each level). Polar decoding may be understood as the polarization process from the channel input values, e.g., by corresponding Log-Likelihood Ratio (LLR) or log-likelihood (LL) calculation.

Figure 5:
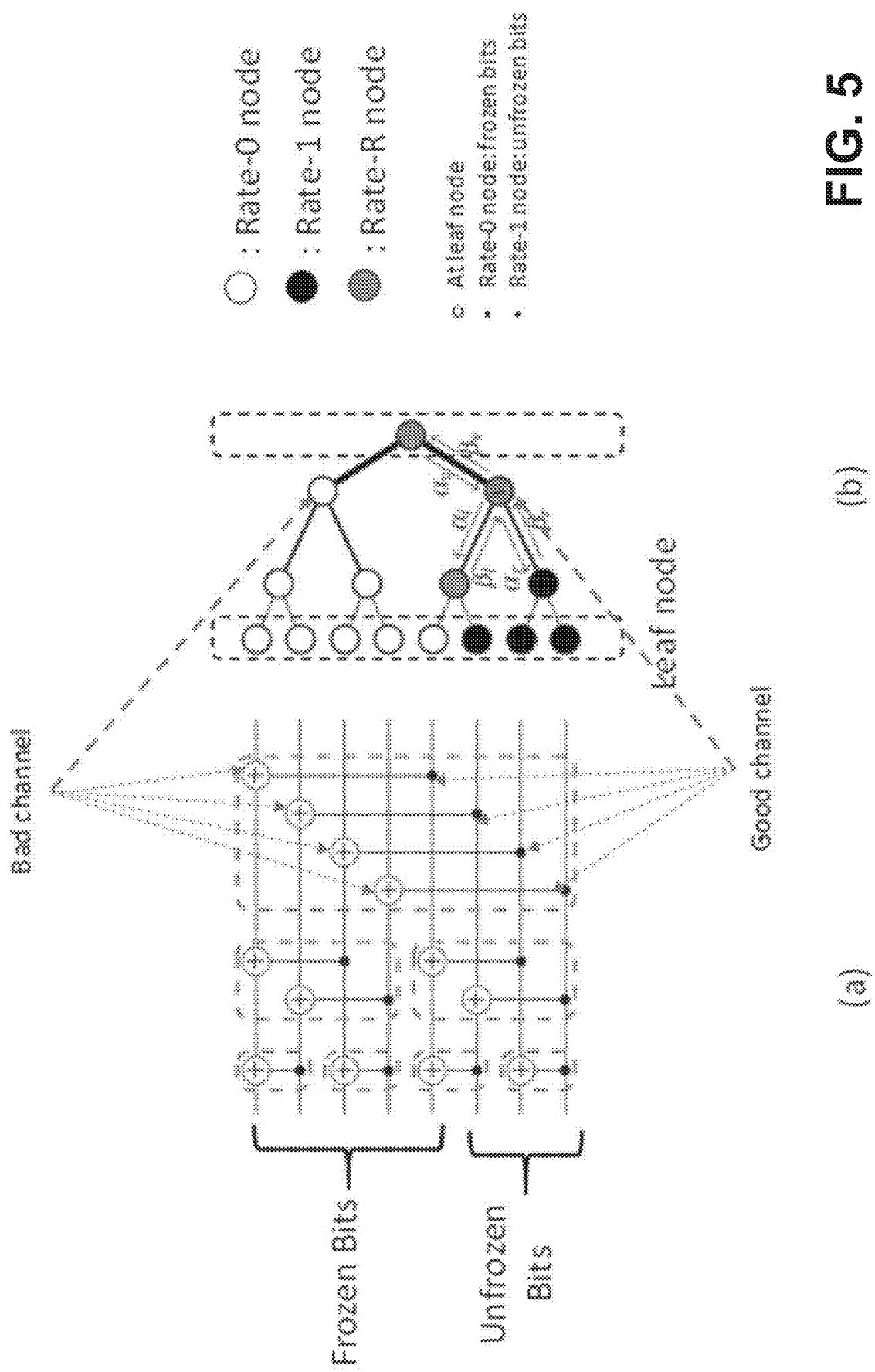
FIG. 5 shows an example tree-graph representation of polar code.

Polar code may be represented by binary expansion (e.g., as shown in FIG. 5). The graph or tree representation of polar code in FIG. 5 may be used for an SC-based decoding structure. It may be (e.g., continuously) divided into two nodes corresponding to two operations of polarization (e.g., initially starting with a single mother node). One branch may correspond to polarization into a bad channel and the other may correspond to polarization into a good channel. For example, nodes (e.g., all nodes) corresponding to a at some levels (e.g., each level) in FIG. 3 may be polarized to bad channels and nodes (e.g., all nodes) corresponding to b at some levels (e.g., each level) in FIG. 3 may be polarized to good channels.

For example, the first divergence from the initial mother node (e.g., as shown in FIG. 5(b)) may have two nodes as child nodes. The first divergence that results in bad channel polarization (e.g., as shown in FIG. 5(b)) may correspond to an XOR operation between values of nodes (1,2), (2,2), (3,2), (4,2) and values of nodes (5,2), (6,2), (7,2), (8,2) (e.g., as shown in FIG. 4). After this operation, output coded bits $c_1$, $c_2$, $c_3$, $c_4$ may be generated. The first divergence corresponding to good channel polarization (e.g., as shown in FIG. 5(b)) may be directly passing operation of nodes (5,2), (6,2), (7,2), (8,2) to the final encoder level. After this operation, output coded bits $c_5$, $c_6$, $c_7$, $c_8$ may be generated (e.g., having the same values of (5,2), (6,2), (7,2), (8,2)). This divergence may be performed continuously until the nodes corresponding to input bits are reached.

The number of levels in FIG. 5 may be the same as in FIG. 4. The initial mother node may correspond to channel input codewords. A dotted connection in FIG. 4 may correspond to a good channel connection and a solid connection may correspond to a bad channel connection.

The leaf nodes in the left most side of FIG. 5(b) may correspond to input bits (e.g., frozen or unfrozen bits). A node may be denoted as a Rate-0 node (e.g., if the child nodes of the node are all frozen bits). A node may be denoted as a Rate-1 node (e.g., if the child nodes of the node are all unfrozen bits). A node may be denoted as a Rate-R node (e.g., if the child nodes of the node are a combination of frozen and unfrozen bits).

In polar decoding, the parameters $\alpha_i$, $\alpha_r$, $\alpha_v$, $\beta_i$, $\beta_r$, $\beta_v$ may be exchanged for successive cancellation decoding.

Relaxation schemes for polar encodings may be based on the calculation of error probability in nodes (e.g., each node) in a polar encoding operation (e.g., as shown in FIG. 2), e.g. corresponding to nN nodes in total and their error probability calculations. This approach may require significant computational load and memory, and may limit the code-rate flexibility of polar codes as code-rates (e.g., each code-rate) may require re-computation of these reliability values.

Error probability may be used for some forms of relaxation. The error probability of some levels (e.g., each level) and corresponding nodes in some levels (e.g., each level) (i,n), where i=1, ..., N (e.g. as shown in FIG. 2, FIG. 3, and FIG. 5), may be calculated. The nodes that are selected for an initial relaxation operation may be determined. For example, a node may be selected if its error probability is less than or larger than a predetermined threshold value. For example, in good channel relaxation, a node may be selected for an initial relaxation operation when the error probability of the node is less than a first predetermined threshold value (e.g., which may be denoted $E_g$). In bad channel relaxation, a node may be selected when the error probability of the node is larger than a second predetermined threshold value (e.g., which may be denoted $E_b$). Some (e.g., all) connected nodes in the subsequent levels may be included in the overall relaxation operation, e.g. starting from the relaxation nodes that are selected for initial relaxation.

A generalized concept of relaxation may include "inactivation" instead of "relaxation," which may result in irregular polar code. The union bound of error rate based on the mutual information for each node may be calculated for candidate groups (e.g., each candidate group) of inactivated nodes. The candidate group that shows the lowest error rate may selected for inactivation, e.g. where the frozen and unfrozen bit indexes based on the new code construction may also be derived.

A challenge in forward error correction (FEC) technologies may be to develop channel codes that can achieve high throughputs (e.g., >100 Gbps) within the practicality constraints of several use-cases (e.g., battery limited wireless terminals and/or sufficient error-correcting performance). One or more conventional implementations for polar encoding may have several drawbacks, e.g., limiting their application in practical use cases. Relaxation operations associated with polar codes are disclosed herein. In examples disclosed herein, complexity and/or latency reduction may be achieved by relaxation, e.g. without sacrificing performance.

For example, conventional relaxation schemes may incur prohibitively high computation complexity while determining the set of encoding nodes (and similar decoding operations) that may participate in a relaxation operation. Conventional relaxation implementations may be based on code construction and may require processing-heavy calculations, e.g. theoretical error probability or mutual information values for nodes (e.g., every node) in the encoding process. The implementation of these calculations, and hence the execution of conventional relaxation implementations, may be prohibitive due to their high complexities.

Certain relaxation schemes may depend on the storage of relaxed node information, e.g. the IDs of encoding nodes that participate in the relaxation operation for possible code block lengths (e.g., every possible code block length) and code rate. This may require significant additional memory requirements in the unit.

After the calculations and selection of the relaxed nodes in an encoding operation, the information indicating relaxed nodes (e.g., node ID and/or relaxation attribute value) may be saved in memory, e.g. in order to apply relaxation during the encoding or decoding process. The used memory may not be negligible and may be substantial, as the memory usage may increase, e.g. in proportion to the code block length and also considering various possible code block lengths and code rates.

Conventional relaxation schemes may provide limited code block-length and code-rate flexibility. In certain applications, flexibility in code block length or code rate may be highly desired. Therefore, encoding and decoding schemes which support high flexibility may be preferred, e.g. particularly depending on the use cases of interest and adaptation to variations of channel environment. In conventional schemes, code lengths (e.g., each code length) and code rates (e.g., each code rate) may require re-calculation of node probability levels and re-determination of relaxed nodes. This property of conventional relaxation implementations may lead to a substantial flexibility limitation of the codes, e.g. due to prohibitive complexity and memory usage associated with these implementations.

Polar encoder and decoder implementations associated with relaxation are described herein. One or more polar encoder and decoder implementations may be associated with complexity reduction.

In relaxation examples, the most reliable or most unreliable input bit indexes, e.g. bit channels in a polar code encoding operation, may be used in the selection of the nodes that will participate in the relaxation. The number of bit indices that may participate in a relaxation operation may be determined, for example based on performance-complexity trade-offs (e.g., the degree of desired complexity reduction vs achieved coding gain). The relaxation attributes of an initial level, relaxation group(s), and a final relaxation encoding level(s)/stage(s) for relaxation group(s) (e.g., each relaxation group) may be identified, e.g. by using one or more of the following: the set of most and least reliable bit channels or the number of bit indexes participating in relaxation operation. Relaxation attributes in encoding levels beyond the initial stage may be determined from the relaxation attributes of preceding levels. XOR operations in the encoding process and message passing operations corresponding to them in the decoding process may be omitted, e.g. depending on the value of the relaxation attributes. For example, an XOR operation may be omitted between two or more consecutive encoding nodes that each have a relaxation attribute indicating that a bit index associated with the encoding node is in a set of most reliable bit indexes or a set of least reliable bit indexes.

Figure 6:
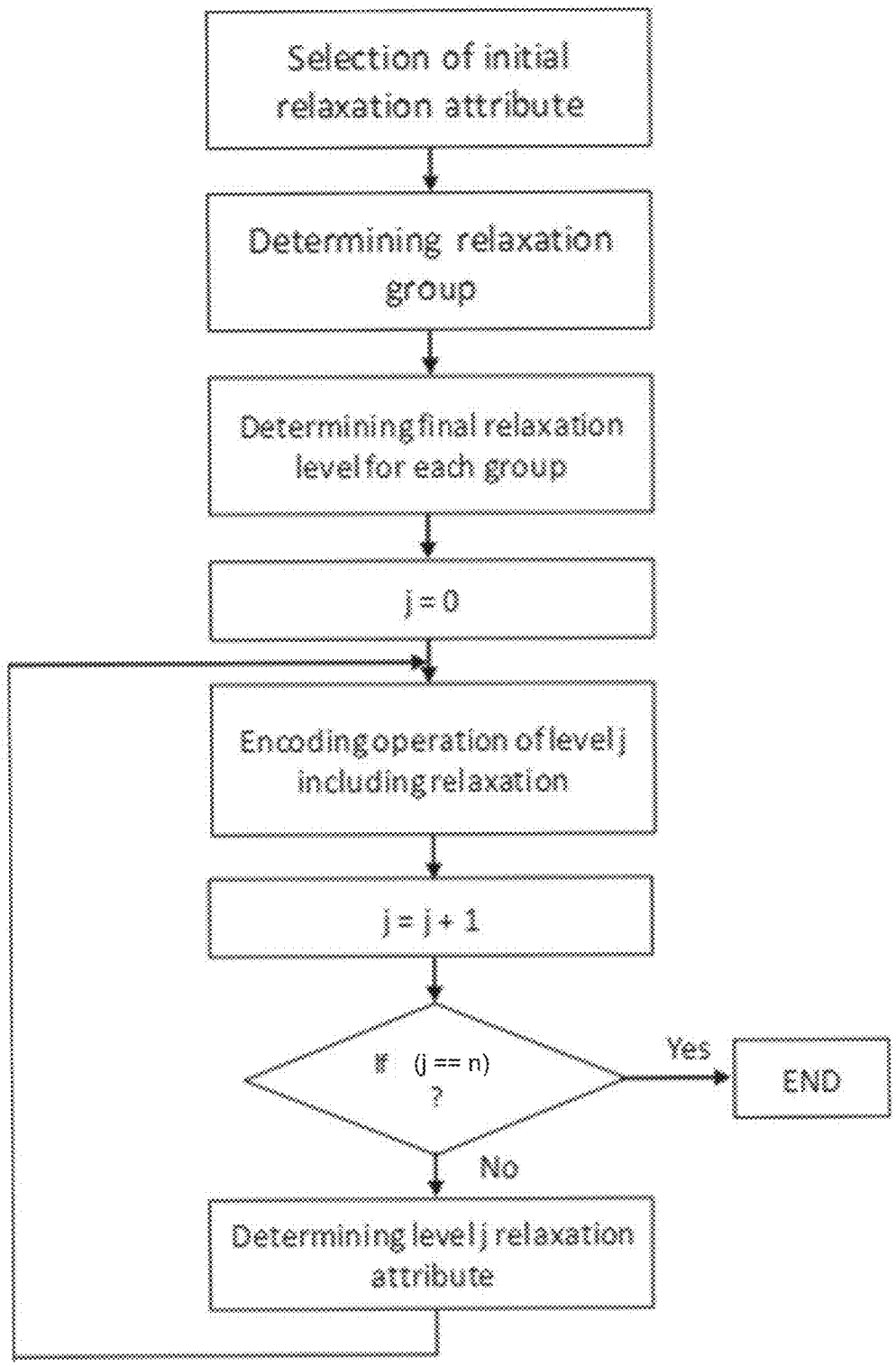
FIG. 6 shows an example of a relaxation implementation.

FIG. 6 shows an example relaxation implementation. As shown in FIG. 6, one or more of the following may occur in an example relaxation implementation. An initial relaxation attribute may be selected for an encoding node. For example, a respective initial relaxation attribute may be selected for each encoding node. A relaxation group may be determined. A final relaxation level may be determined for each relaxation group. A current relaxation level may be set to zero. An encoding operation (e.g., including relaxation) may be performed on a relaxation group for the current relaxation level. The current relaxation level may be incremented (e.g., by 1). Whether the final relaxation level has been reached may be determined. If the final relaxation level has been reached, no further relaxation may occur. If the final relaxation level has not been reached, a relaxation attribute may be determined for the incremented relaxation level. The encoding operation may be repeated for each relaxation level up to the final relaxation level.

For example, there may be a set of one or more encoding nodes (e.g., which may be referred to as nodes), with each encoding node being associated with a bit index and a relaxation level. An encoding node may be denoted as (i,j), with i representing the bit index and j representing the relaxation level associated with the encoding node. For example, an encoding node associated with bit index 3 and relaxation level 0 may be denoted as (3, 0). Two encoding nodes associated with the same bit index and consecutive relaxation levels may be connected (e.g., linked). For example, encoding node (3, 0) and encoding node (3, 1) may be connected. An encoding node (e.g., each encoding node) may be associated with a relaxation attribute.

An initial relaxation attribute may be selected for an encoding node in the set of encoding nodes. For example, a respective initial relaxation attribute may be selected for each encoding node in the set of encoding nodes. A graph-representation of a polar encoding operation (e.g., as described in FIGS. 2 and 4) may be followed. The level 0 may correspond to input bits. Values of nodes in level 1 may be calculated from level 0 input bits (e.g., by XOR operations). These operations may proceed to the level n−1. Output coded bits of level n may be produced.

The relaxation implementation may be combined with encoding and may start from level 0 and proceed to the next level of encoding. Initial relaxation requirements may need to be defined (e.g., in the beginning of the proposed relaxation implementation). For example, initial relaxation requirements may refer to an extent of relaxation that may be given initially. The initial relaxation requirements may be a percentage of encoding nodes that may be relaxed following relaxation. The initial relaxation requirements may be identified by a number of most reliable bits and a number of least reliable bits. The initial relaxation requirements may be based on a complexity reduction-error correction performance trade-off parameter. This parameter may depend on specific use-cases. For example, it may be assigned a value according to the operation (e.g., either in static or dynamic fashion).

Figure 7:
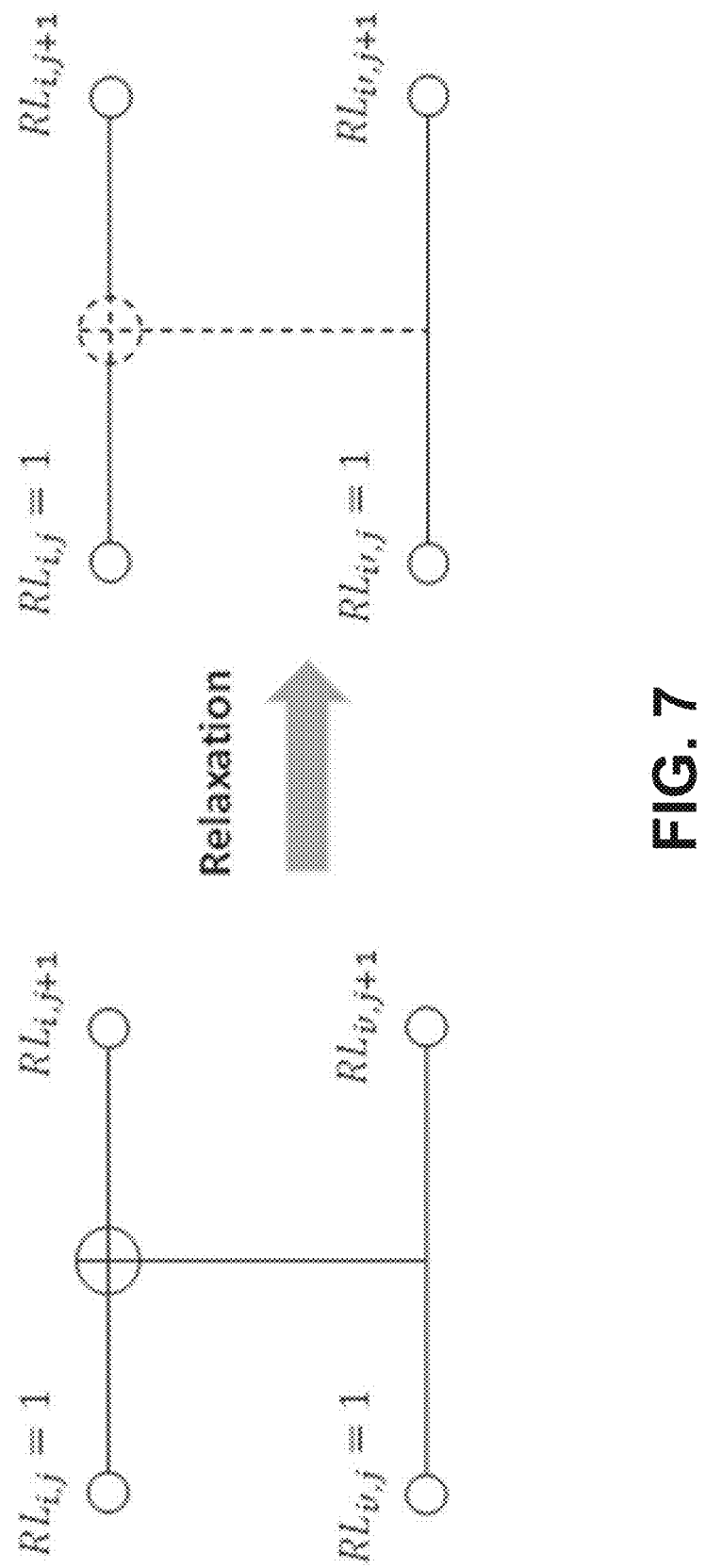
FIG. 7 shows an example of indicating relaxation by a relaxation attribute of a node.

A relaxation attribute of a node (i,j) may be denoted as $RL_{i,j}$. If paired nodes (e.g., both paired nodes) in j level have a value of $RL_{i,j}=1$, the pair may be relaxed and no XOR operation among these nodes may be performed. If at least one node of the paired nodes has a value of $RL_{i,j}=0$, there may be no relaxation and an XOR operation may be performed. FIG. 7 shows an example of this relation. In a non-relaxed polar code implementation, $RL_{i,j}$ values may all be equal to 0.

In polar code encoding, the indexes of two encoding nodes that are paired and have XOR operation at level j may described as follows:

node (i,j) and (i+$2^j$, j) may be paired when mod(i, $2^{j+1}$)=x, where mod(a, b) is the remainder when b divides a.

x may be a value equal to, for example, 0 (e.g., when the index i starts from 0) or 1.

There may be an XOR operation between node (i,j) and (i+$2^j$,j) in an encoding implementation.

Nodes (i,j) and (i+1,j) may be paired (e.g., always) when mod(i, 2)=x, e.g. where the bit reversing interleaver is applied in the encoding operation. x may be a value equal to, for example, 0 (e.g., when the index i starts from 0) or 1. $RL_{i,0}$ may stand for an initial relaxation attribute.

Initial relaxation attributes may be determined as described herein.

Initial attributes, $RL_{i,0}$, may be defined, e.g. by reliability order of polar code construction. The most reliable bits and the most unreliable bits may be selected, e.g. as an initial input bit index of relaxation involved nodes. The number of most reliable bits may be denoted as $N_g$, and the number of least reliable bits may be denoted as $N_b$. The participating reliable bits and unreliable bits may correspond to good channel and bad channel relaxations, respectively. Selection of the most reliable and least reliable bits may be done from a sequence (e.g., a single sequence) indicating the reliability of input bit indexes or a sequence (e.g., a single sequence) indicating the input indexes in reliability order, e.g. without the necessity of full code construction. With this approach, complexity and/or latency involved in code constructions (e.g., in Bhattacharyya code construction or Gaussian approximation code construction) may be reduced.

Polar code construction may be performed by a reliability sequence of input bit indexes. The most reliable input bit indexes or most unreliable input bit indexes may be acquired, e.g. based on the sequence showing the reliability order of input bit indexes (e.g., each input bit index). Using a reliability sequence of input bit indexes may not use a complex calculation of a reliability value of each node and it may increase efficiency.

Initial relaxation attribute determination may be performed as described herein. One or more of the following may apply.

A reliability sequence of the polar code of length N may be obtained. A number of nodes to be relaxed in an encoding operation may be identified, e.g., using a given code rate (K/N) and a desired complexity-error performance trade-off value. The total number of relaxation candidate nodes (e.g., a total number of "1's" of initial attributes) in the $0^{th}$ level may be denoted as $N_g+N_b$, where $N_g$ relaxation candidate nodes (e.g., a number of "1's" selected from most reliable bits) may be used in good-channel relaxation, and $N_b$ relaxation candidate nodes (e.g., a number of "1's" selected from most unreliable bits) may be used in bad-channel relaxation. A first relaxation attribute (e.g., 1) may be selected for an encoding node if the bit index associated with the encoding node is included in a set of most reliable bit indexes or a set of least reliable bit indexes (e.g., as shown in Equation 3). A second relaxation attribute (e.g., 0) may be selected for an encoding node if the bit index associated with the encoding node is not included in a set of most reliable bit indexes or a set of least reliable bit indexes (e.g., as shown in Equation 4). If i∈[1, . . . , N] is included in most reliable $N_g$ indexes or i∈[1, . . . , N] is included in most unreliable $N_b$ indexes, then $$RL_{i,0}=1 \qquad \text{Equation 3}$$

else $$RL_{i,0}=0. \qquad \text{Equation 4}$$

$N_g$ may be not more than K, whereas $N_b$ may be on the order of $N_g$. The selection of $N_b$ and $N_g$ may depend on the desired performance outcome.

In examples, one may select $$N_g=K \qquad \text{Equation 5}$$

$$N_b=N-K \qquad \text{Equation 6}$$

which may result in maximum complexity reduction by good and bad channel relaxation.

In examples (e.g., which may provide better performance of good channel relaxation) one may select $$N_g \approx \frac{1}{2} \times K, \text{ when } \frac{K}{N} \leq 1/2 \qquad \text{Equation 7}$$

$$N_g \approx \frac{K}{N} \times K, \text{ when } \frac{K}{N} > 1/2. \qquad \text{Equation 8}$$

Some of the initial $RL_{i,0}=1$ values may be changed to 0 (e.g., depending on which initial level nodes are selected for relaxation).

$N_g>0$ may correspond to good channel relaxation and $N_b>0$ may correspond to bad channel relaxation. Good channel relaxation may correspond to relaxing good channel polarization, e.g. sufficient polarization and reliability. Bad channel relaxation may correspond to relaxing bad channel polarization, e.g. inadequate polarization and no further improvement in the future polarization may be expected. When $N_g$ is set to a high value, the complexity reduction ratio may also be high. The performance of relaxed polar code may become worse due to limited polarization created in the encoding. When $N_g$ is set to a low value, the complexity reduction ratio may also be low. Relaxed polar code error correction performance may become better (e.g., comparable to non-relaxed polar code). Non-relaxed polar codes may not show better performance than relaxed polar code. Relaxed polar code may show better performance than non-relaxed polar code, e.g. if a proper value of $N_g$ is selected, which may be in addition to the benefit of complexity reduction. Enhancement in performance may be because there may be increased minimum or average reliability by relaxation.

The complexity reduction ratio (CR) may be defined as the ratio of the number of reduced XOR operations (e.g., by relaxation) to the number of XOR operations without relaxation in a polar code encoder.

The number of input bits for bad channel relaxation may be the same as the number of frozen bits, which may maximize the CR value. This may be referred to as full frozen bit relaxation.

Relaxation groups may be determined, for example based on the selected relaxation attributes for the encoding nodes. One or more of the following may apply.

A relaxation group may include two or more encoding nodes from the set of encoding nodes. For example, a relaxation group may include a first encoding node and a second encoding node. The first encoding node may be associated with a first bit index and a first relaxation level (e.g., an initial relaxation level), and the second encoding node may be associated with a second bit index and the first relaxation level. The first relaxation level may be relaxation level 0. The first bit index and the second bit index may be consecutive. For example, the first encoding node may be (3, 0) and the second encoding node may be (4, 0). The first encoding node and the second encoding node may each be associated with a first relaxation attribute, which may indicate that the first bit index and the second bit index are included in a set of most reliable bit indexes or a set of least reliable bit indexes.

Relaxation indices may be grouped based on their local continuity in an input bit domain, e.g. after initialization of the relaxation index and initial attributes (e.g., $RL_{i,0}$). A relaxation group determination may include the following:

For b=n to c with decrement 1
    For a=1 to N with increment $2^b$
        If all $RL_{i,0}$ is 1 and $RL_{i,0}$ is not selected as the group of relaxation for all i from i=a to a+$2^b$−1,
            bit indexes from i=a to a+$2^b$−1 are selected as a group of relaxation,
            b is stored as a final relaxation level for the group
        Endif
    Endfor(a)
Endfor(b), where c may be a parameter that determines the minimum block size of the relaxation group, and where the bit indexes of the selected relaxation group may correspond to a component polar code. The component polar code may include one or more bit indexes. For example, as shown in the pseudocode, a relaxation group determination may include determining whether one or more (e.g., all) attributes of each block with a size of $2^b$ has a value of 1. If all attributes of a block with a size of $2^b$ have a value of 1, the block may be selected for relaxation. A current block (e.g., a block with attributes currently being determined) may not include a previously selected block. For example, a relaxation group determination may include searching through N bits. The search may be performed block by block (e.g., with a block size of $2^b$). If the block that is currently being search is not previously relaxed, the block may be selected for relaxation.

The minimum block size of a relaxation group may be determined by a value denoted by c such that the minimum block size may be $2^c$ (e.g., where c≥0). The value c may be 1 for good and/or bad channel relaxation, or may be a larger value (e.g., to support generalization of the polarization operation to include more than 2 bit indices). In the case of c=1, at least two bit indices may be involved in polarization, and at least two nodes may be relaxed in the minimum level. In this case, the relaxation attribute of isolated input bits (e.g., single isolated input bits) which have a value of 1 in the initial relaxation attribute may be changed to a value of 0. The relaxation attribute values of the consecutive blocks that are not larger than $2^c$ and include consecutive bit indices with attributes equal to 1 may be (e.g., all) set to 0. Thus, the number of 1s in $RL_{i,0}$ may be the same as $N_g+N_b$, e.g. for c=0, and may be smaller than $N_g+N_b$, e.g. for c>0. Changing $RL_{i,0}$ from 1 to 0 may include the following:

For b=c to 0 with decrement 1
    For a=1 to N with increment $2^b$
        If all $RL_{i,0}$ is 1 and $RL_{i,0}$ is not selected as the group of relaxation for all i from i=a to a+$2^b$−1
            $RL_{i,0}$=0 for all i from i=a to a+$2^b$−1
        Endif
    Endfor(a)
Endfor(b).

Changing $RL_{i,0}$ from 1 to 0 (e.g., as described herein) may be performed (e.g., simultaneously) during encoding. In examples, for a bit index i (e.g., for each bit index i) from 1 to N, a value for bit index i−1 may be expressed as a binary digit, and the number of zeros before the first one may be counted from the least significant bit. The number of zeroes before the first one may be denoted as d. Counting the number of zeroes before the first one in the binary expression may be equivalent to checking the ones of $RL_{i,0}$ from a to a+$2^d$−1 for b=d to c. For example, N=32, i−1=28=0x11100 and number of zeros from the least significant is 2. By checking the ones of {$RL_{29,0}$}, {$RL_{29,0}$, $RL_{30,0}$}, {$RL_{29,0}$, $RL_{30,0}$, $RL_{31,0}$, $RL_{32,0}$}, e.g. in case of c=0, a group of relaxation may be determined. A smaller group may be included in a larger group. The smaller group included may not be considered, e.g. if the large group is already determined as a relaxation group.

The relaxation in the first level (e.g., the $0^{th}$ level) may be applied when at least one node of paired nodes has $RL_{i,0}$=1 (e.g., differently from FIG. 7, where both paired nodes may have $RL_{i,0}$=1), e.g. when c=0. This relaxation, e.g. by "OR" condition instead of "AND" condition, may be extended or may not be extended to the remaining levels.

Figure 9:
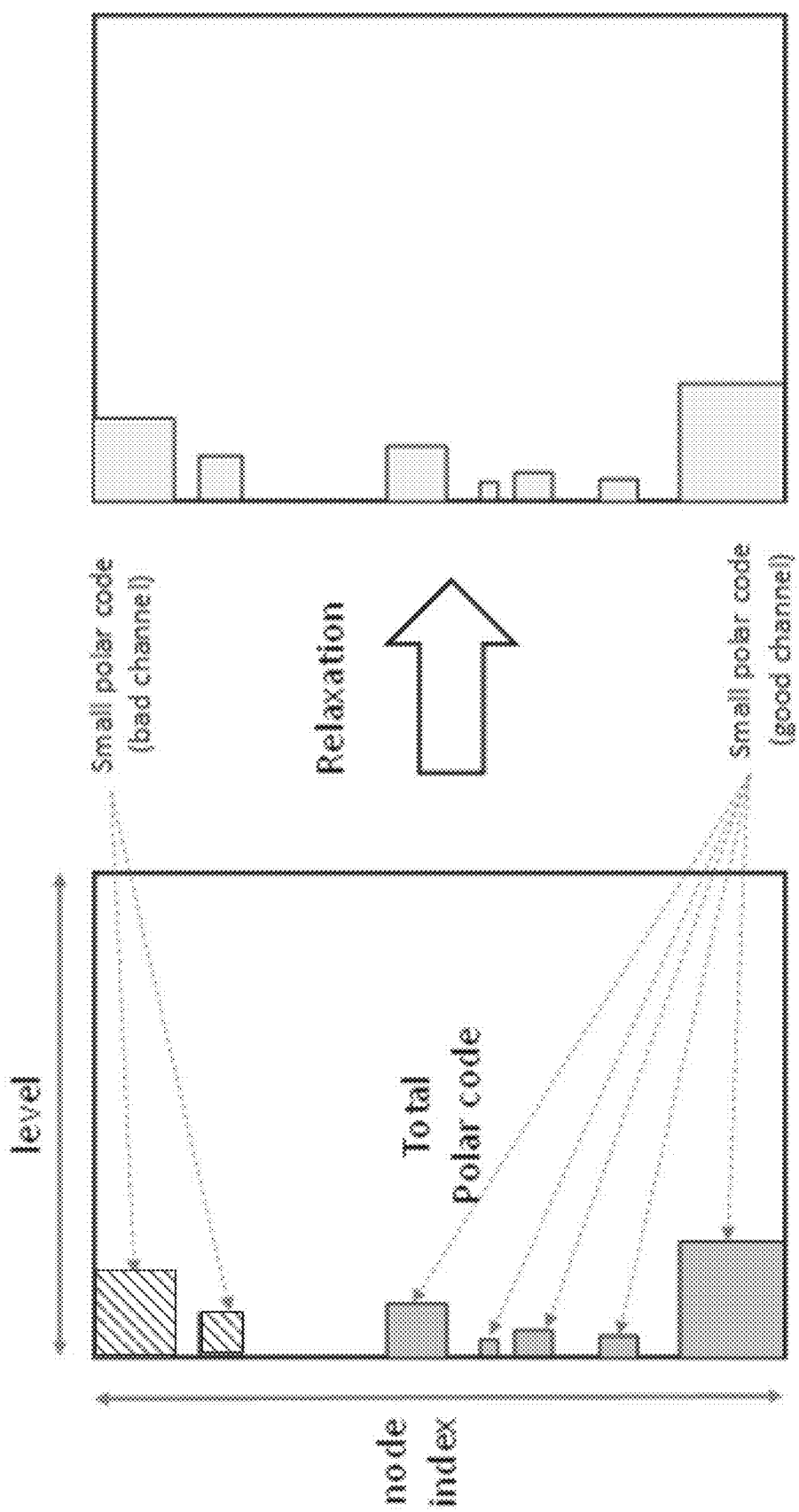
FIG. 9 shows an example of relaxation of polar code.

Consecutive ones may be checked to identify a relaxation group (e.g., if all $RL_{i,0}$ is 1 and $RL_{i,0}$ is not selected as the group of relaxation for all i from i=a to a+$2^b$−1). This may be generalized to another condition, e.g. if $$\frac{e}{2^b} \geq f$$

is true and $RL_{i,0}$ is not selected as the group of relaxation for all i from i=a to a+$2^b$−1. e may be the number of ones from i=a to a+$2^b$−1 and f may be a positive real number not more than 1 (e.g., f≈1 and/or f≤1). An implementation disclosed herein may be a special case of f=1. f may be the code rate of the component (e.g., embedded) polar code as shown in FIG. 9, for example in the case of good channel relaxation. The component polar code may be and/or may include a set of bit indexes. A bit index (e.g., each bit index) in the component polar code may correspond to a bit index of an encoding node. The code rate f of the component polar code may be calculated by dividing the number of bit indexes in the component polar code that correspond to unfrozen bit indexes of encoding nodes with a relaxation attribute of 1 divided by the number of bit indexes in the component polar code.

Figure 8:
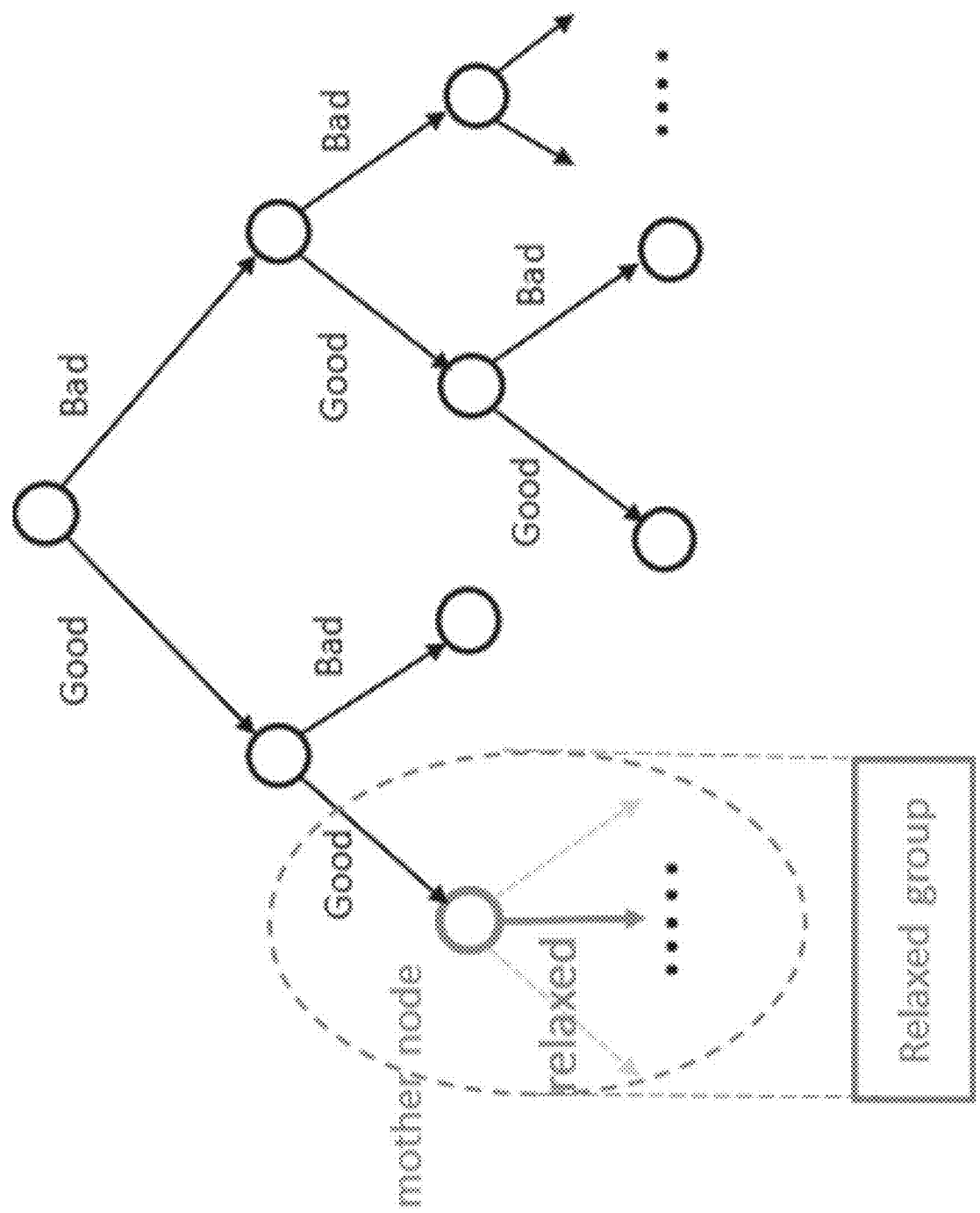
FIG. 8 shows an example of selection of a relaxation group.

In a relaxation approach, group selection may correspond to the selection of the encoding node where the relaxation operation may be initiated. For instance, for levels (e.g., each level) of divergence in FIG. 5(b), a node may be selected (e.g., if that node is reliable enough for good channel relaxation or has sufficiently low reliability for bad channel relaxation). This approach is shown in FIG. 8. The selection of the node where relaxation is started may be done automatically, e.g. using the values of $N_g$ or $N_b$.

Polar code may be configured in several ways. In some configurations, the input bit index may be bit-reversed, e.g. in comparison to FIG. 2. "Bit-reversed" may mean that the order of binary digit expression is reversed. For example, "0x11100" may be bit-reversed to "0x00111." If BR (x, n) is defined as the bit-reversed value of x (BR(0x11100,5)=0x00111=7), the above may be modified as follows:

For b=n to c with decrement 1
   For a=1 to N with increment $2^b$
      If all $RL_{BR(i-1,n)+1,0}$ is 1 and $RL_{BR(i-1,n)+1,0}$ is not selected as the group of relaxation for all i from i=a to a+2-1, bit indexes BR(i−1, n)+1 from i=a to a+$2^b$−1 is selected as a group of relaxation
      b is stored as a final relaxation level for the group
   Endif
   Endfor(a)
Endfor(b).

"BR (i−1, n)+1" may be "BR (i, n)" (e.g., instead) if indexing starts from 0 instead of 1.

A final relaxation level (e.g., a second relaxation level) for a group (e.g., each group) may be determined. For a bit index group (e.g., each bit index group) that will participate in relaxation, there may be a maximum number of encoding levels b to which relaxation may be applied. Relaxation may start from level 0 and end at level b−1 for a group (e.g., each group) as described herein. Relaxation may be stopped, e.g. after the level b−1, and may not be applied for corresponding relaxation groups in the levels b, b+1, . . . , n. The final relaxation level may be determined by the length (e.g., or size) of a relaxation group. The final relaxation level may be set to another value, e.g., which may be less than b. For example, the final relaxation level may be the same as the initial relaxation level (e.g., level 0). No relaxation may be applied for the final level b because the final level may correspond to the output nodes of embedded polar code, e.g. as shown in FIG. 9.

A next level relaxation attribute may be determined. The relaxation attribute for a level (e.g., each level) may be determined from the previous level (e.g., as shown in FIG. 6). In examples, one may set:

$$RL_{cn(i),j}=1, \text{ if } RL_{i,j-1}=1 \qquad \text{Equation 10}$$

where "cn(i)" may stand for a connected node with node (i,j−1) at level j and cn(i)=i when the configuration shown in FIG. 2 is used. This may imply that the relaxation attribute of the node in the current level is set to 1 if the relaxation attribute of connected node in the previous level is 1.

For example, relaxation may be continued up to a final relaxation level when they are connected. The final relaxation level may be determined to be level b−1. A relaxation group (e.g., a block of consecutive encoding nodes with a relaxation attribute of 1) may have a size of $2^b$ (e.g., a number of consecutive relaxation attributes of 1).

In certain situations (e.g. when a bit reversing interleaver is applied at encoding), the following equations may apply:

$$cn(i) = \left\lfloor \frac{\mathrm{mod}(i-1, 2^{n-j+1})}{2} \right\rfloor + \lfloor -i - 1 \rfloor * 2^{n-j+1} + 1, \qquad \text{Equation 11}$$
if mod(i − 1, 2) = 0

$$cn(i) = \left\lfloor \frac{\mathrm{mod}(i-1, 2^{n-j+1})}{2} \right\rfloor + \left\lfloor -\frac{i-1}{2^{n-j+1}} \right\rfloor * 2^{n-j+1} + 2^{n-j} + 1, \qquad \text{Equation 12}$$
if mod(i − 1, 2) = 1.

In certain situations (e.g. if the index i starts from 0), the following equations may apply:

$$cn(i) = \left\lfloor \frac{\mathrm{mod}(i, 2^{n-j+1})}{2} \right\rfloor + \left\lfloor \frac{i}{2^{n-j+1}} \right\rfloor * 2^{n-j+1}, \qquad \text{Equation 13}$$
if mod(i, 2) = 0

$$cn(i) = \left\lfloor \frac{\mathrm{mod}(i, 2^{n-j+1})}{2} \right\rfloor + \left\lfloor \frac{i}{2^{n-j+1}} \right\rfloor * 2^{n-j+1} + 2^{n-j}, \qquad \text{Equation 14}$$
if mod(i, 2) = 1 where $\lfloor x \rfloor$ may be the maximum integer not more than x.

Determination of a relaxation attribute (e.g., in the next level) may be performed in an incremental manner, e.g. as encoding is processed from left level to right level as shown in FIG. 7. In examples, the total relaxation attributes from the initial level to the final level may be determined before the encoding operation (e.g., combined with the initial three boxes as shown in FIG. 6). For example, relaxation attributes for one or more levels after the initial level may be performed concurrently with one or more of selecting initial relaxation attributes, determining relaxation groups, and/or determining a final relaxation level for each group. For example, relaxation attributes for levels between the initial level and final level (e.g., inclusive) may be determined and/or selected concurrently.

The proposed relaxation implementations may correspond to the selection of smaller (e.g. component) polar codes within the overall polar code and its encoding operations, and then relaxing (e.g., completely) these component codes (e.g. no XOR operations within the component codes). For example, a component polar code may be a subset of a relaxation group. For instance, the final (or last) relaxation level, b−1, may correspond to a component polar code of size B=$2^b$ within the parent polar code. FIG. 9 demonstrates multiple component codes that may participate in a relaxation operation.

Figure 10:
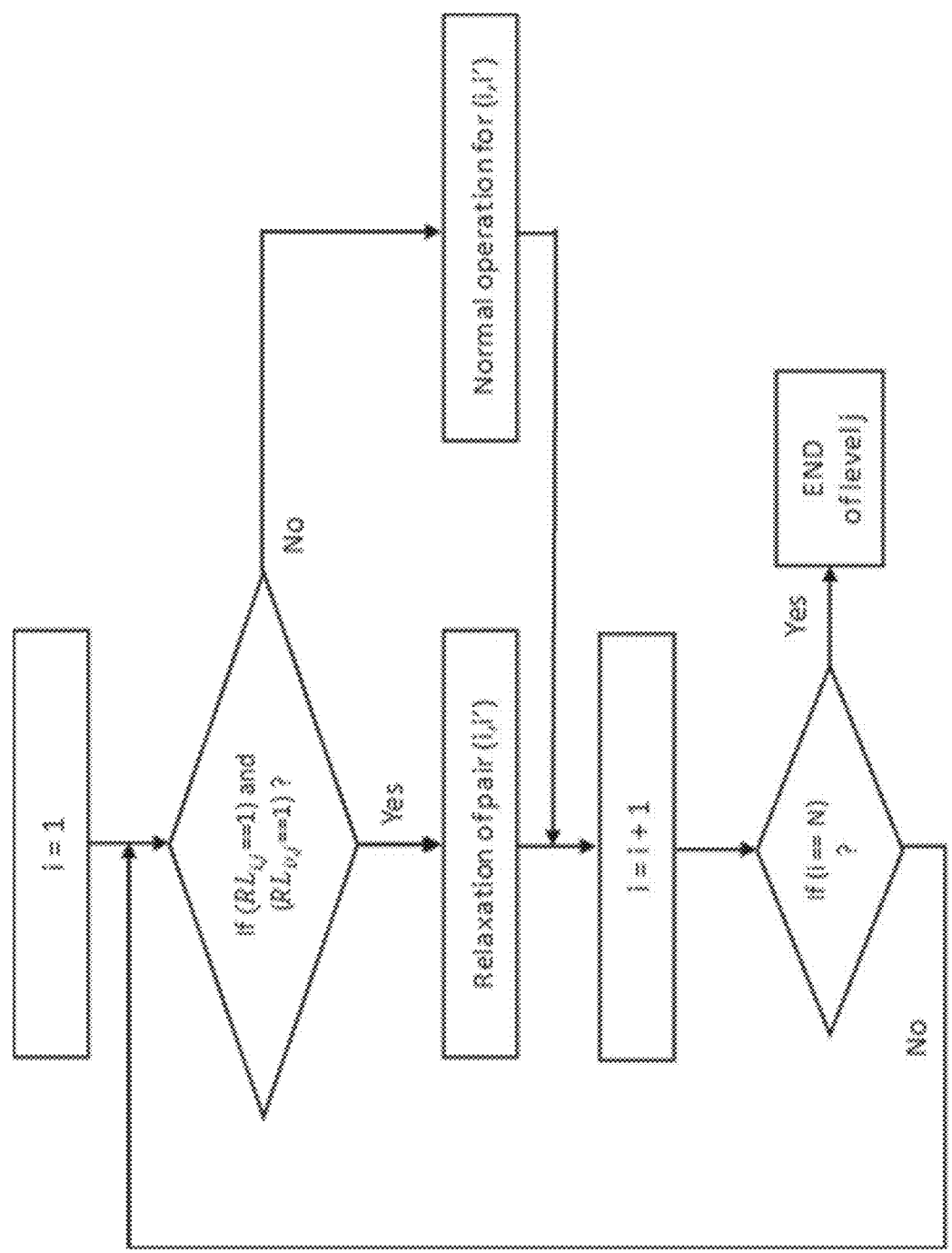
FIG. 10 shows an example encoding operation of level j including relaxation.

Encoding operations of level j (e.g., including relaxation) may be performed as described herein. An encoding operation may be described as shown in FIG. 10. Polar encoding (e.g., conventional polar encoding) may start from level 0 and the node values of j may be calculated from the previous level j−1 for pairs (e.g., each pair). The values of nodes at level n may be final coded bits, e.g. when j=n−1.

For XOR operations (e.g., each operation) of a pair (i,j) and (i', j), both $RL_{i,j}$ and $RL_{i',j}$ may be 1. i and i' may be consecutive bit indexes (e.g., i and i' may differ by 1). The pair may be relaxed and there may be no XOR operation performed for the pair. For example, (i,j) and (i',j) may be included in a relaxation group. Encoding may be performed on (i,j) and (i',j), including relaxation (e.g., with an XOR operation between (i,j) and (i',j) omitted). j may be incremented by 1 and encoding may be performed on (i, j') and (i', j'), including relaxation (e.g., with an XOR operation between (i,j') and (i',j') omitted). j may continue incrementing and encoding may be performed on encoding nodes in the jth level until the final relaxation level is reached.

A compact relaxation attribute determination may be described herein.

A compact implementation that demonstrates the described relaxation node selection may be described, e.g. which may assume relaxation limited to good channel relaxation and b=1. Bad channel relaxation or combination with two schemes may be performed in a similar manner.

| Compact relaxation description |
| --- |
| Initialization |
| 1: Select most reliable $N_g$ indices $\{g_0, g_1, \ldots, g_{N_g-1}\}$ from all input bit indices. |
| 2: $RL_{g_i,0} = 1$ for all $g_i$, $i = 1, \ldots, N_g$ |
| 3: for $i = 1$ to $\frac{N}{2}$ with increment 1 do |
| 4. if $RL_{2i,0} = 0$ or $RL_{2i+1,0} = 0$ |
| 5: $RL_{2i,0} = 0$, $RL_{2i+1,0} = 0$ |
| 6: endif |
| 7: endfor |
| Begin |
| 8: for j = n to 1 with decrement 1 do |
| 9: for i = 1 to N with increment $2^j$ do |
| 10: if $RL_{k,0} = 1$ for all $k = i, \ldots, i + 2^j - 1$ |
| 11: $RL_{k,l} = 1$ for all $k = i, \ldots, i + 2^j - 1$, and $l = 1 \ldots, j - 1$ |
| 12: endif |
| 13: endfor |
| 14: endfor |
| End |

For good channel relaxation, the most reliable $N_g$ bit indices may be selected as attributes of initialization for $RL_{i,0}$, e.g. in line 2.

A single relaxation attribute with a value of 1 between two consecutive input indices may be excluded, e.g. because the minimal unit of relaxation may be done for a polarization between them. The lines from 3 to 7 may be performed for this exclusion.

8 to 14 in the compact relaxation description may describe the extension of the relaxation technique from the initialization stage j=0 to remaining stages. When $RL_{k,0}$ (e.g., all) from k=i to k=i+$2^j$−1 has a value of 1, $RL_{k,l}$ (e.g., all $RL_{k,l}$) from k=i to k=i+$2^j$−1 and from l=0 to i=j−1 may be equal to 1. This may correspond to the relaxation of the component polar code, e.g. starting from input bit index i with a size of 2'. The value of j=n may correspond to full polar code length and there may be no need to implement the case in real implementation e.g., because initial nodes (e.g., all initial nodes) participate in relaxation. The finding a group of consecutive ones may proceed until the minimum block size of 2, e.g. because c=1. Checking of a smaller group may not be performed when a larger group is determined, e.g. in the loop of i, and looping may stop.

Relaxation for rate matching may be performed as described herein. A rate matching may be applied, e.g. to adapt a code rate or coded block length for polar encoding. There may be one or more implementations which may be considered for rate matching of polar codes. For example, puncturing, shortening, and/or repetition may be considered.

Puncturing may be performed as described herein. Parts of polar coded bits may be excluded (e.g., punctured), for example depending on the specific puncturing pattern (e.g., may start from the coded bit index 1). There may be corresponding input bits to punctured output coded bits. The value of corresponding input bits may be set to zero. The corresponding input bit index to the punctured bit may be the same as the punctured output bit index, e.g. in the encoder structure as shown in FIG. 2. Corresponding input bits may be considered as less reliable bits than the other input bits and may be handled as frozen bits, e.g. in polar code construction. In decoding, the LLR of a punctured output bit may be set as 0, e.g. because there is no allowable information for the punctured bit. The same probability may be assumed for 0 and 1.

The proposed relaxation may not be changed when puncturing is applied, e.g. because corresponding input bits may be included in least reliable bits. For example, the proposed relaxation implementations may be applicable even if puncturing is applied during polar encoding. Puncturing may convert one or more input bits into frozen bits. The converted frozen bits may be considered as very unreliable bits, and may be included as part of bad channel relaxation. The same implementation as for bad channel relaxation (e.g., frozen bit relaxation) may be applied.

Shortening may be performed as described herein. Parts of polar coded bits may be excluded (e.g., shortened), e.g. depending on the specific shortening pattern (e.g., may start from the coded bit index N). There may be corresponding input bits to shortened output coded bits. The value of corresponding input bits may be set to zero. The corresponding input bit index to the shortened bit may be same as the shortened output bit index, e.g. in the encoder structure as shown in FIG. 2. Corresponding input bits may be considered as less reliable bits than the other input bits and may be handled as frozen bits, e.g. in polar code construction. In decoding, the LLR of shortened output bit may be set as infinite, e.g. because the value of shortened and coded output bit is 0.

The proposed relaxation may not be changed when shortening is applied, e.g. because corresponding input bits may be included in least reliable bits. For example, the proposed relaxation implementations may be applicable even if shortening is applied during polar encoding. Shortening may convert one or more input bits into frozen bits. The converted frozen bits may be considered as very unreliable bits, and may be included as part of bad channel relaxation. The same implementation as for bad channel relaxation (e.g., frozen bit relaxation) may be applied.

A number of puncturing or shortening may be denoted as P. P may be included in N−K(P<N−K). A code rate for polar encoding may be R=K/M, e.g., when M=N−P.

Repetition may be performed as described herein. Repetition of polar code may be performed, e.g. when there is no puncturing or shortening. The proposed relaxation implementation may be applied, e.g. without any consideration. For example, relaxation may be performed in a similar manner regardless of whether repetition is performed.

Polar code decoding implementations (e.g., with relaxation) may be performed as disclosed herein.

Figure 11:
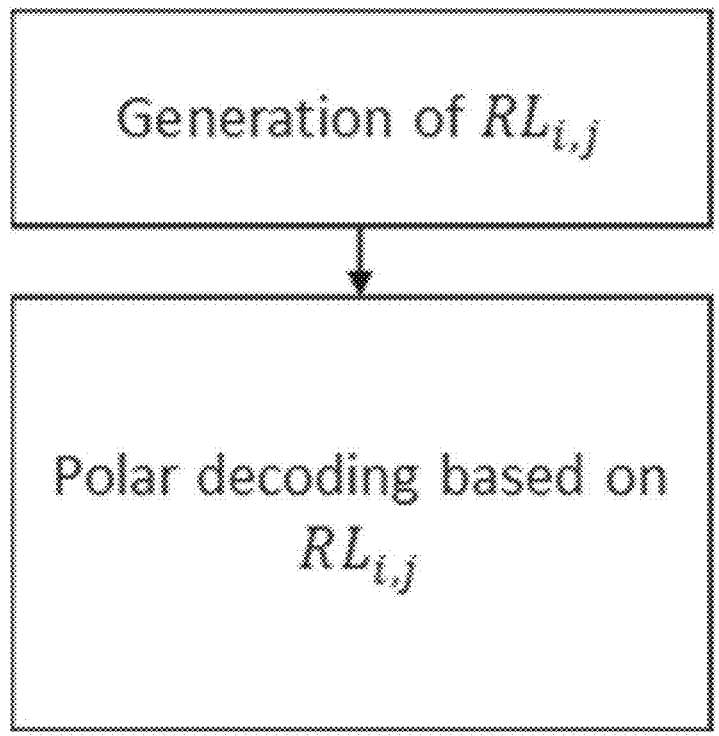
FIG. 11 shows an example of decoding a relaxed polar code.

Decoding employed for polar codes may be modified based on the defined relaxation. The defined relaxation may be used to identify the operations to be omitted in decoding (e.g., as shown in FIG. 11).

Figure 12:
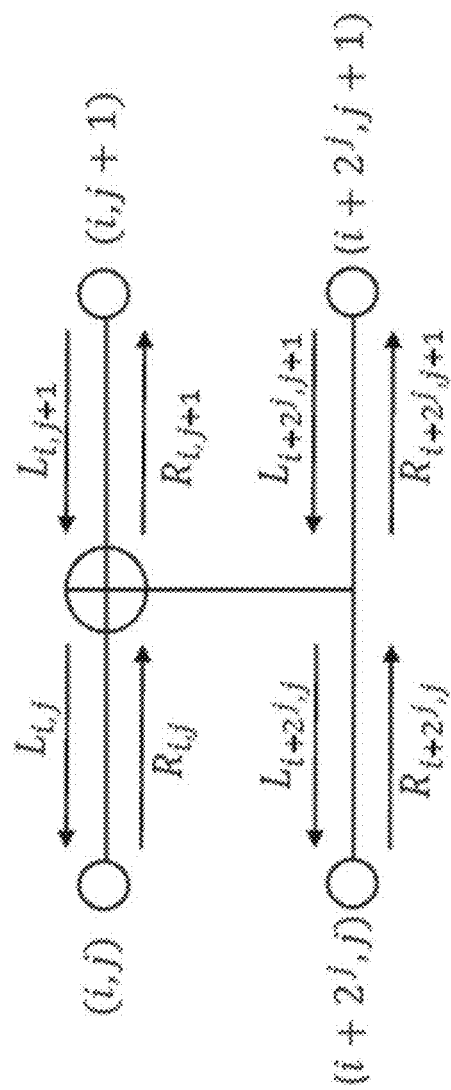
FIG. 12 shows an example decoding module.
Figure 13:
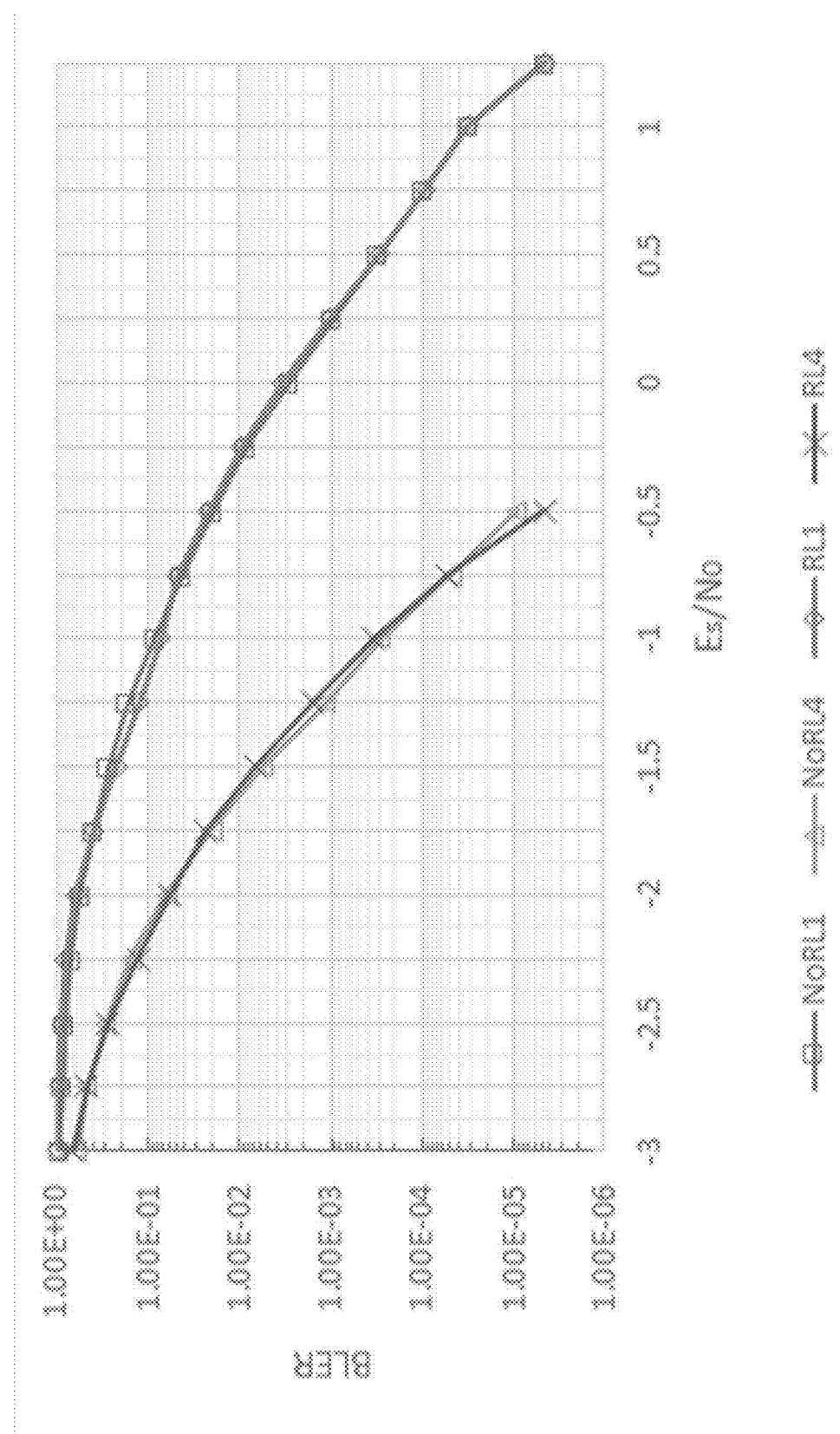
FIG. 13 shows an example BLER performance comparison where a code rate may be equal to ¼.
Figure 14:
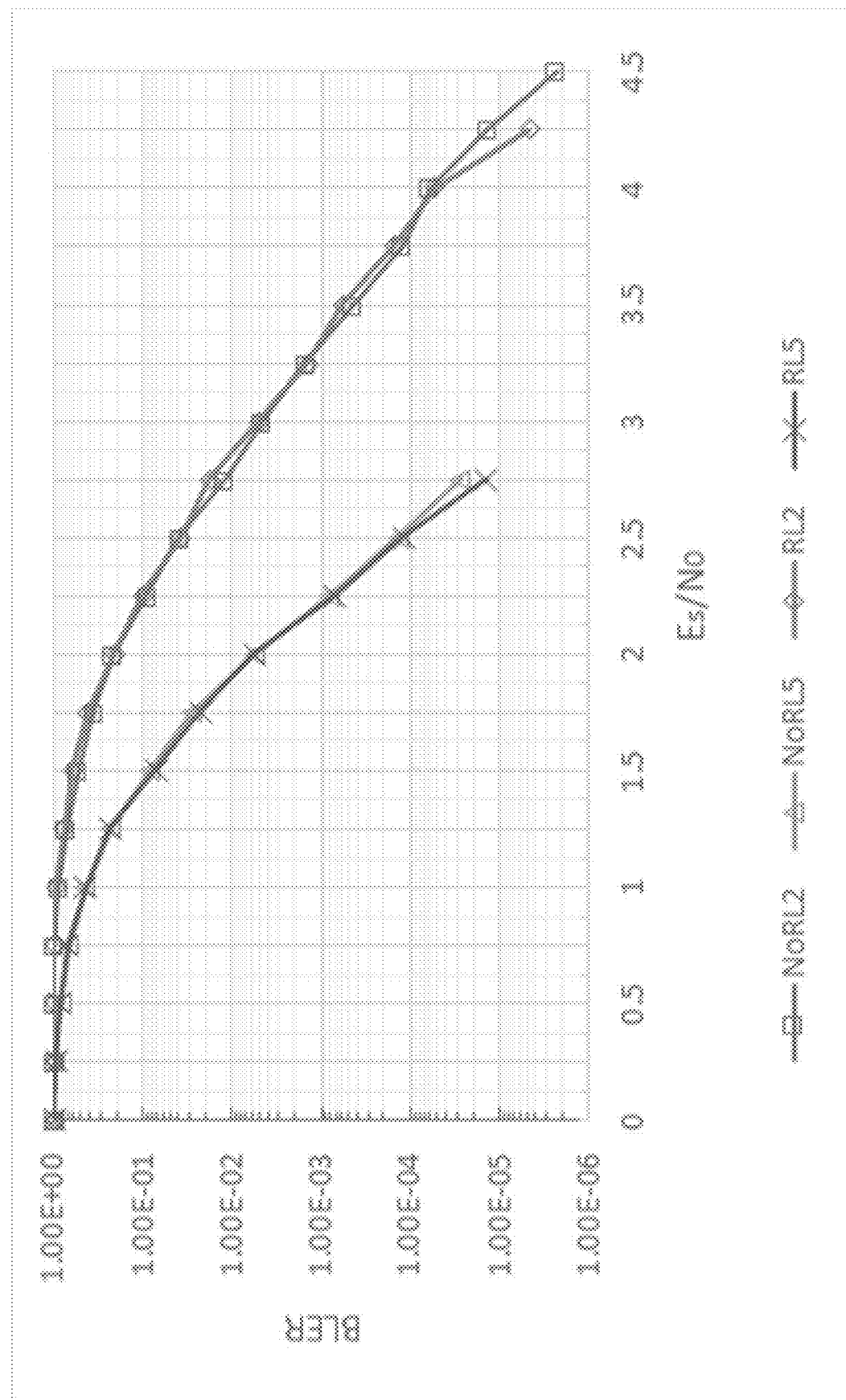
FIG. 14 shows an example BLER performance comparison where a code rate may be equal to ½.

Decoding polar code may be categorized into one or more implementations, for example Successive Cancellation (SC) based and Belief Propagation (BP) based. In the decoding implementations, the basic unit for decoding may be shown as in FIG. 12.

Message passing to left or right may be changed for a relaxed pair.

$$L_{i,j} = G(L_{i,j+1}, L_{i+2^j,j+1} + R_{i+2^j,j})$$ Equation 15

$$L_{i+2^j,j} = G(R_{i,j}, L_{i,j+1}) + L_{i+2^j,j+1}$$ Equation 16

$$R_{i,j+1} = G(R_{i,j}, L_{i+2^j,j+1} + R_{i+2^j,j})$$ Equation 17

$$R_{i+2^j,j+1} = G(R_{i,j}, L_{i,j+1}) + R_{i+2^j,j}$$ Equation 18 where G(x,y) may be equal to sgn(x)sgn(y)min(|x|, |y|) and sgn(x) may be a sign value of x. When x≥0, sgn(x)=1 and when x<0, sgn(x)=−1. |x| may represent the absolute value of x.

To employ the relaxation in the decoding operation, $RL_{i,j}$ may be generated (e.g., initially) for nodes and levels (e.g., all nodes and levels) for decoding of proposed polar code with relaxation, as described herein. $RL_{i,j}$ may be generated in a parallel manner with decoding.

Equations 15-18 may be modified as follows:

$$L_{i,j} = L_{i,j+1}$$ Equation 19

$$L_{i+2^j,j} = L_{i+2^j,j+1}$$ Equation 20

$$R_{i,j+1} = R_{i,j}$$ Equation 21

$$R_{i+2^j,j+1} = R_{i+2^j,j}$$ Equation 22 when, for example, at least one of $RL_{i,j}$ and $RL_{i',j}$ is 0 for a relaxed pair, i and i', and where $i'=i+2^j$, e.g., as shown in the configuration described in FIG. 2.

For an SC-based implementation, decoding and determination of relaxation operations in the decoder levels may be performed in a parallel manner, e.g. since the decoding may start from level n−1 and the maximum value of the final level in the relaxed group may be less than n.

For a BP-based implementation, the message passing from level k to level k+1 may be analogous to polar encoding, and the decoding as well as the relaxation operation determination may be performed (e.g., simultaneously) as described herein.

Numerical results may be presented herein.

Simulation conditions for evaluations described herein may be summarized in Table 1.

TABLE 1

Simulation conditions

| Conditions | Parameters |
|---|---|
| N | 1024 |
| K(including CRC) | 280, 536, 792 |
| Code rate | ¼, ½, ¾ |
| CRC | 3GPP NR 24 bit CRC |
| Decoding scheme | CA-SCL (list size = 1 and 8) |
| Code construction | 3GPP NR polar code sequence |
| Modulation | QPSK |
| Minimum counted error | 100 block error |

The details of evaluated implementations may be summarized in Table 2. Relaxation implementations (e.g., all) may be based on good channel selection (e.g., selection of unfrozen bits).

TABLE 2

Legend details

| Legend | K | list size | $N_g$ | $N_b$ | CR (only $N_g$) | CR ($N_g$, $N_b$) |
|---|---|---|---|---|---|---|
| NoRL1 | 280 | 1 | 0 | 0 | 0 | 0 |
| NoRL2 | 536 | 1 | 0 | 0 | 0 | 0 |
| NoRL3 | 792 | 1 | 0 | 0 | 0 | 0 |
| NoRL4 | 280 | 8 | 0 | 0 | 0 | 0 |
| NoRL5 | 536 | 8 | 0 | 0 | 0 | 0 |
| NoRL6 | 792 | 8 | 0 | 0 | 0 | 0 |
| RL1 | 280 | 1 | 140 | (744) | 2.54% | 33.48% |
| RL2 | 536 | 1 | 268 | (488) | 6.8% | 22.3% |
| RL3 | 792 | 1 | 512 | (232) | 16.58% | 21.9% |
| RL4 | 280 | 8 | 140 | (744) | 2.54% | 33.48% |
| RL5 | 536 | 8 | 268 | (488) | 6.8% | 22.3% |
| RL6 | 792 | 8 | 512 | (232) | 16.58% | 21.9% |

An evident coding gain by relaxation as proposed herein in a case of code rate 1/2 may be observed (e.g., at a high SNR region). The same performance may be observed in the other code rates of ¼ and ¾.

The performance improvement (e.g., by relaxation) may be due to the averaging effect on reliability. The error performance in bit channels (e.g., each bit channel) of polar code may be non-uniform and different bit by bit. Overall BLER performance may be more dependent on the error rates of less reliable bits (e.g., rather than those of more reliable bits). Some more reliable bits may have higher reliability than bits without relaxation. Reliability in some nodes may be improved at the expense of sacrificing high reliability in some nodes, e.g. by applying relaxation. BLER or BER performance may be improved, e.g. by minimizing or averaging reliability of overall bit channels.

Bhattacharyya code construction-based relaxation may be performed as described herein.

Bhattacharyya code construction for polar encoding may be described herein. Bhattacharyya code construction may be independent from other implementations described herein. For example, Bhattacharyya code construction and relaxation may be different and independent from other implementations described herein.

Conventional Bhattacharyya code construction may be performed as follows:

Initialization of all $$z_{i,n} = e^{-10^{\frac{dSNR}{10}}}$$

from design SNR (=dSNR) for i=1, . . . , N
    For j=n to 1 with decrement 1
        Calculate Bhattacharyya parameters for all pairs at level j $$z_{cn(i),j-1} = z_{i,j} + z_{i',j} - z_{i,j} \cdot z_{i',j}$$

$$z_{cn(i'),j-1} = z_{i,j} \cdot z_{i',j}$$

Endfor(j)

Sorting $z_{i,0}$ for all i=1, 2, . . . , N in descending order and select indexes from N−K+1 to N. As shown in the pseudo-code, one or more indexes of frozen and unfrozen bits may be determined. To determine the indexes, the reliability of an input bit (e.g., each input bit) may be calculated. The reliability may be calculated from the right-most nodes corresponding to channel symbols.

A proposed Bhattacharyya code construction for relaxation may be performed as follows:
Initialization of all $$z_{i,n} = e^{-10^{\frac{dSNR}{10}}}$$

from design SNR (=dSNR) for i=1, ..., N
  Initially $RL_{i,j}=0$ for all i and j.
  For j=n to 1 with decrement 1
   For i=1 to N with increment 1
    If ($RL_{cn(i),j}=0$ and $RL_{cn(i'),j}=0$),
      $z_{cn(i),j-1}=z_{i,j}+z_{i',j}-z_{i,j} \cdot z_{i',j}$
      $z_{cn(i'),j-1}=z_{i,j} \cdot L_{i',j}$
      If $z_{cn(i),j}<t_g$
        $RL_{cn(i),j-1}=2$
      Endif
      If $z_{cn(i),j}>t_b$
        $RL_{cn(i),j-1}=3$
      Endif
      If $z_{cn(i'),j}<t_g$
        $RL_{cn(i'),j-1}=2$
      Endif
      If $z_{cn(i'),j}>t_b$
        $RL_{cn(i'),j-1}=3$
      Endif
    endif
    if ($RL_{cn(i),j} \neq 0$ or $RL_{cn(i'),j} \neq 0$),
      $z_{cn(i),j-1}=z_{i,j}$
      $z_{cn(i'),j-1}=z_{i',j}$
      $RL_{cn(i),j}=1$
      $RL_{cn(i'),j}=1$
    Endif
  Endfor(j)

Sorting $z_{i,0}$ for all i=1, 2, ..., N in descending order and select indexes from N−K+1 to N.

As shown in the pseudocode, a reliability value for $z_{i,j}$ may be determined. $z_{i,n}$ may be the initial reliability (e.g., probability of error) determined by SNR. From right to left, $z_{i,j}$ may be calculated based on Bhattacharyya parameter calculation.

$t_g$ and $t_b$ may be thresholds used to determine whether the nodes are candidates for relaxation. $t_g$ or $t_b$ may be decided heuristically based on evaluation for a specific required BLER level.

$RL_{i,j}$ (e.g., all $RL_{i,j}$) may be acquired from the proposed Bhattacharyya code construction. $RL_{i,j}$ may be used for encoding and decoding in the same manner described herein. There may be no process of determining $RL_{i,j}$ for a next level, and the final level value may not need to be determined in encoding. The conditions of relaxation based on values of $RL_{i,j}$ may be different from other implementations as described herein. For example, if at least one node of two paired nodes in j level has a value of $RL_{i,j}=1$, the pair may be relaxed and no XOR operation between these nodes may be performed. If both paired nodes in j level have a value of $RL_{i,j}=0$, there may be no relaxation and a standard XOR operation may be performed.

An attribute value of $RL_{i,j}=2$ or $RL_{i,j}=3$ may correspond to the starting point of good channel and bad channel relaxation, respectively. Nodes with these relaxation attributes may not be relaxed, and encoding and decoding operations (e.g., without relaxation) may be performed for them. From the next level to the level where these attributes occur, the connected nodes may be relaxed and their $RL_{i,j}$ may be equal to 1.

The proposed Bhattacharyya code construction for relaxation may be used for an application that does not require flexibility of encoder or decoder application. For example, the proposed Bhattacharyya code construction may be used for a fixed code rate application.

An adaptive polar encoder and decoder complexity reduction (e.g., which may be denoted as relaxation) implementation may be performed as described herein.

The disclosed polar encoder and decoder complexity reduction (e.g., which may be denoted as relaxation) implementations may be employed and configured adaptively, e.g. by utilizing various system, network, and device parameters (e.g., which may include channel quality, the received signal power at the decoding entity, the battery status of the transmitting and receiving entities, desired BER/QoS performance, etc.). An adaptive configuration may provide performance gains, e.g. reduced power consumption at the transmitting and receiving entities and improved BER/QoS at the receiving entity.

A transmitter may obtain the parameters from the network and the receiver, identify the level of complexity reduction necessary at the transmitter, receiver, or both, and inform the receiver for the corresponding information to be employed in complexity reduction (e.g., as described herein). The receiver may inform the transmitter regarding the complexity reduction it desires. Both entities may employ complexity reduction based on this information.

Implementations for a transmitter obtaining necessary parameters from a receiver and network may be provided herein. The transmitter may inform the receiver regarding the complexity reduction level. Other cases (e.g., the receiver providing the complexity reduction level to the transmitter) may be performed as described herein.

Figure 16:
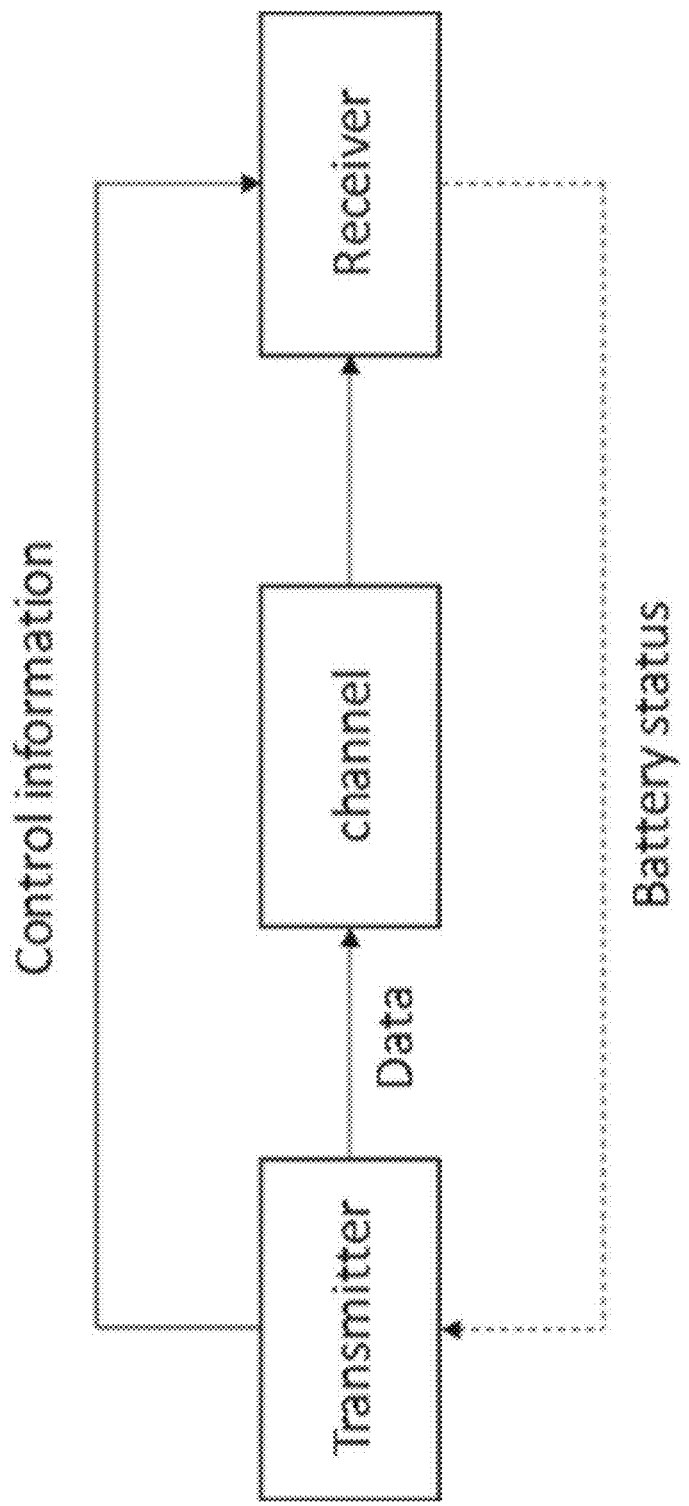
FIG. 16 shows an exemplary adaptive channel encoder/decoder complexity reduction (e.g., relaxation) system.

FIG. 16 shows an example of an adaptive system (e.g., an exemplary adaptive channel encoder/decoder complexity reduction (relaxation)). A transmitter may transmit polar coded symbols, and a receiver may decode corrupted symbols from a channel. The transmitter may identify (e.g., initially) the desired complexity reduction (e.g., which may be denoted as a relaxation level) to be achieved at the encoder (e.g. at the transmitter), and the decoder (e.g. at the receiver). Based on complexity reduction information obtained from the control channel, the receiver may configure the decoder. The decoder may have the same structure of relaxation as the transmitter and may perform polar decoding. The control channel may be an independent channel from the data channel, or may be jointly configured with the data channel.

The control information related to the complexity reduction may be $N_g$ and/or $N_b$ as described herein. A long field in the control channel format may be required, e.g., when the block length is long (e.g. the potential range of $N_g$ and/or $N_b$ is large). The range may be divided into a number of intervals. The maximum or minimum or average value of $N_g$ and/or $N_b$ may be indexed, e.g. to reduce the redundancy caused by long control field. This index value (e.g., instead of the full $N_g$ and/or $N_b$ information) may be delivered by the control channel.

The complexity reduction detailed herein or conventional relaxation schemes may employ a plurality of offline calculations of relaxation attributes, e.g. at the polar encoding nodes. The relaxation attribute calculations may take different values for possible complexity reduction levels (e.g., degree of relaxation). The exact or index values corresponding to a relaxation attribute (e.g., each relaxation attribute) may be calculated. These indexes may be delivered from the transmitter to the receiver, e.g. by a control channel.

The information to be utilized in determining the complexity reduction/relaxation level may be composed of various system, network, and device parameters. The complexity reduction level at the receiver may be determined by the allocated receive power to that particular receiver by the transmitter. In an example, when the scheduled power level to a specific receiver is sufficiently high (e.g., a received SNR can achieve better than desired BER/QoS), further complexity reduction at the receiver (e.g., its decoder) may be employed. Similarly, in the cases of relatively low received SNR, the complexity reduction assigned at the receiving entity may be lowered to yield sufficient BER performance.

A degree of complexity reduction may be determined by a transmitter depending on a receiver's information of battery status. The information may be delivered by the other control channel (e.g., as shown by the dotted line in FIG. 16). Delivery of battery status information may be similar to Channel State Information (CSI) reporting. The transmitter may deliver the control information corresponding to high degree of relaxation, e.g. when the receiver has low battery power level. The transmitter may deliver the control information corresponding to low degree of relaxation, e.g. when the receiver has high battery power level, or when the receiver has low battery power level but it is charging.

Figure 15:
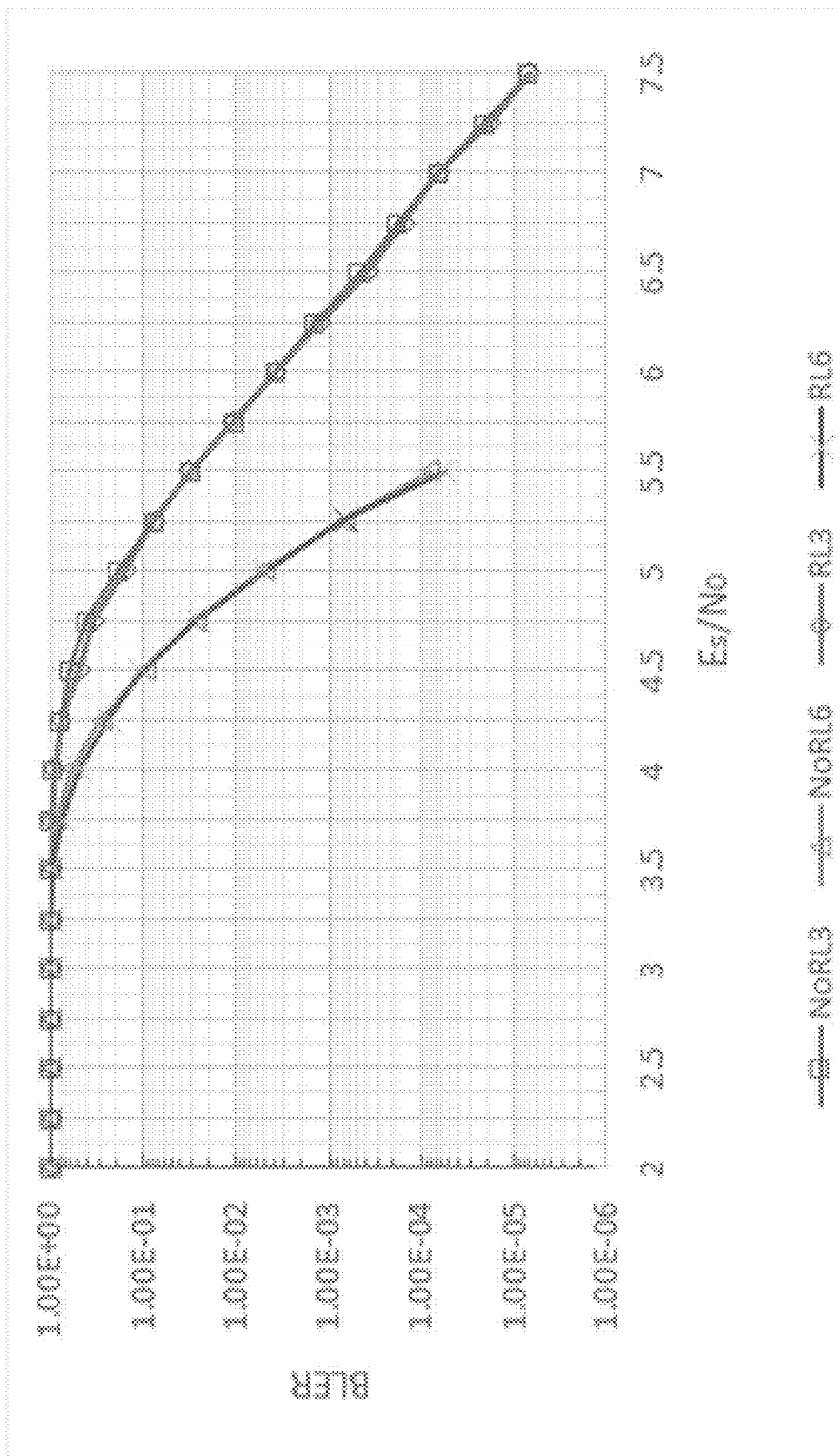
FIG. 15 shows an example BLER performance comparison where a code rate may be equal to ¾.
Figure 17:
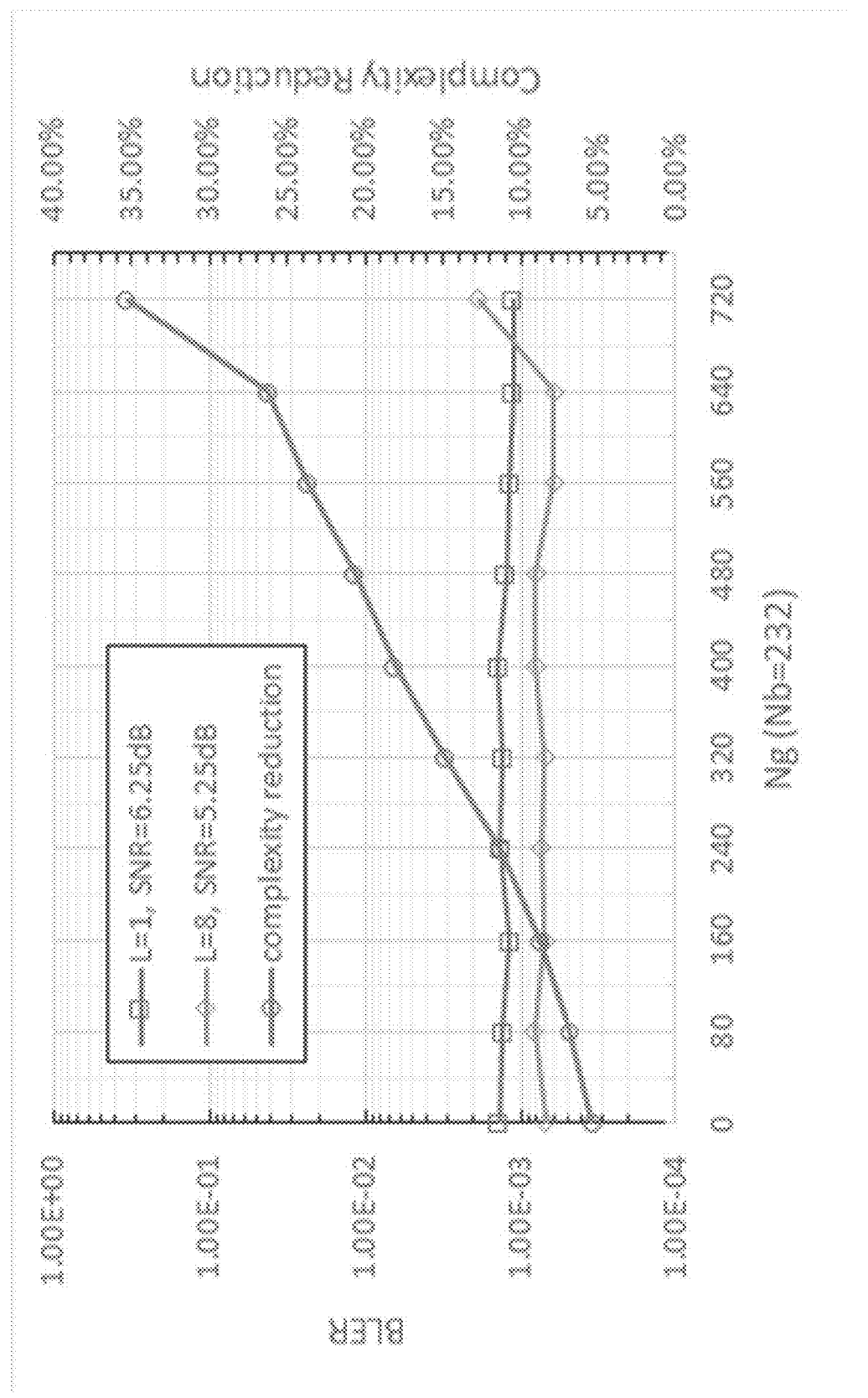
FIG. 17 shows an example complexity reduction-BLER performance trade-off.

FIG. 17 shows a trade-off relation between complexity reduction and BLER performance. The simulation conditions may be the same as in FIG. 15.

The complexity reduction-BLER performance trade-off may be seen as shown in FIG. 17. For the case of a receiving entity requiring a minimum of 10^-3 BLER, based on the implementations disclosed herein, the transmitter (e.g., or the receiver itself) may identify the complexity reduction parameter, e.g. Ng=~640. This information may be exchanged between the transmitter and receiver, which may then be used in the disclosed polar encoder and decoder operations.

Figure 18:
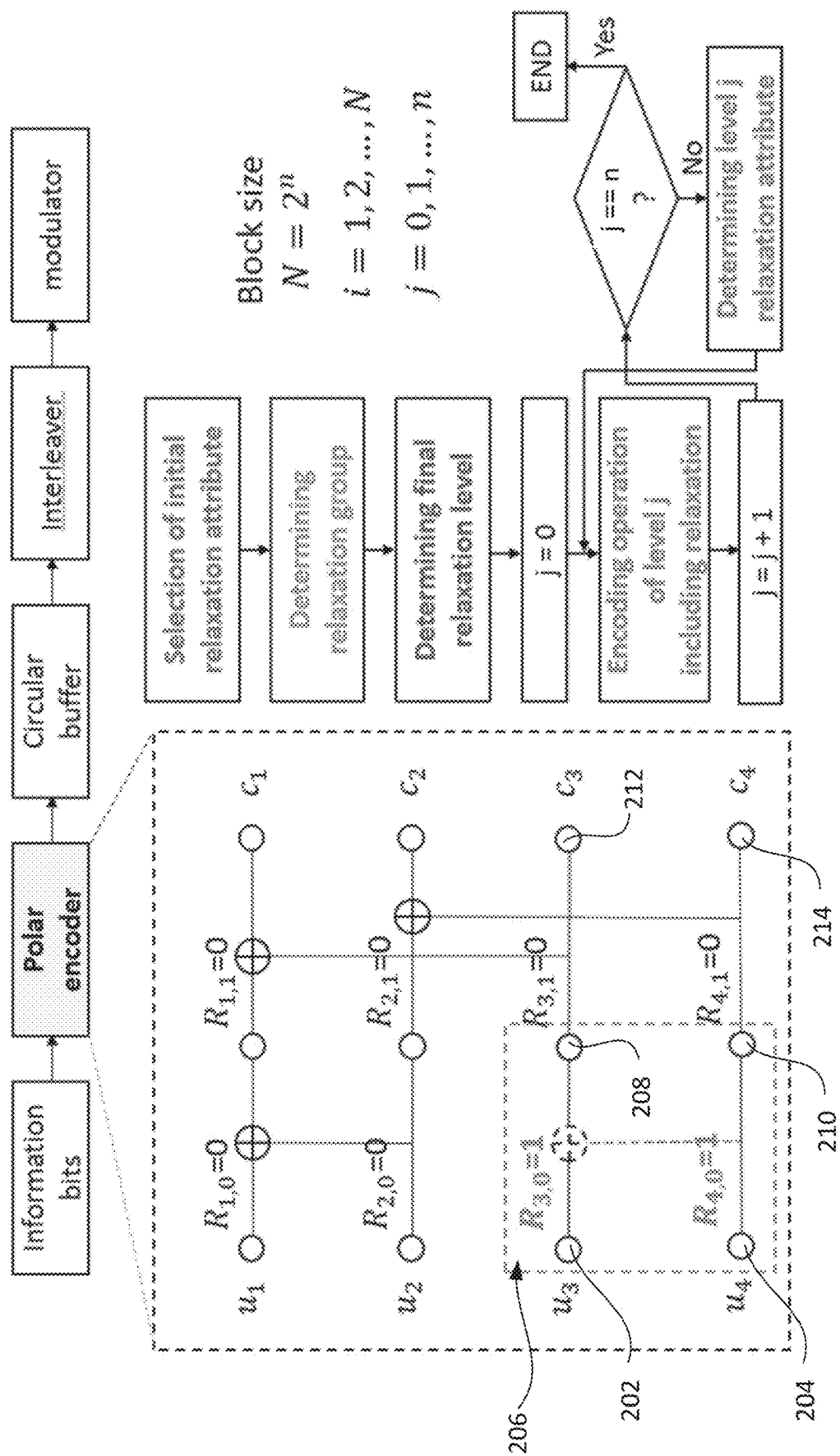
FIG. 18 shows an example associated with relaxation.

FIG. 18 shows an example associated with relaxation. As shown in FIG. 18, there may be one or more encoding nodes (e.g., encoding nodes 202, 204, 208, 210 shown in FIG. 18). Each encoding node may be associated with a bit index and a level (e.g., a relaxation level). For example, as shown in FIG. 18, there may be three levels, level 0, level 1, and level 2. For example, encoding node 202 may be associated with bit index 3 and level 0, encoding node 204 may be associated with bit index 4 and level 0, encoding node 208 may be associated with bit index 3 and level 1, and encoding node 210 may be associated with bit index 4 and level 1. Encoding nodes associated with the same bit index and consecutive levels (e.g., encoding nodes 202 and 208, or encoding nodes 204 and 210) may be connected or linked.

An initial relaxation attribute (e.g., $RL_{i,0}$) may be selected for each encoding node in an initial level (e.g., level 0), where i may denote the bit index for the encoding node. A first relaxation attribute (e.g., 1) may be selected for encoding nodes associated with most reliable (e.g., $N_g$) and/or most unreliable (e.g., $N_b$) bit indices. Whether a bit index is one of the most reliable or most unreliable bit indexes may be determined by comparing a reliability value associated with the bit index to a first threshold and/or a second threshold. For example, if the reliability value associated with the bit index is higher than the first threshold, the bit index may be a most reliable bit index, or if the bit index is lower than the second threshold, the bit index may be a most unreliable bit index. A second relaxation attribute (e.g., 0) may be selected for bit indexes that are not one of the most reliable or most unreliable bit indexes. As shown in FIG. 18, the first relaxation attribute may be selected for encoding nodes 202 and 204.

A relaxation group in the initial level may be determined based on the selected relaxation attributes. A relaxation group may include two or more encoding nodes. For example, as shown in FIG. 18, relaxation group 206 may include encoding nodes 202 and 204. Encoding nodes in the relaxation group may be associated with consecutive bit indexes. Each encoding node in the relaxation group may be associated with the first relaxation attribute.

A final relaxation level for a relaxation group (e.g., each group) may be determined. For example, the final relaxation level may indicate a final level where relaxation is performed on the relaxation group. For example, as shown in FIG. 18, there may be two relaxation levels, level 0 and level 1. The final relaxation level may be determined based on the size of the relaxation group. For example, the final relaxation level may be equal to $\log_2(m)-1$, where m may be the size of the relaxation group. A final relaxation level for relaxation group 206 may be determined to be level 0 (e.g., because $\log_2(2)-1=0$).

Encoding may be performed on the relaxation group depending on the selected relaxation attributes for the encoding nodes in the relaxation group. Encoding may be performed on the encoding nodes in the relaxation group based on the relaxation levels. For example, as shown in FIG. 18, encoding may be firstly performed on the level 0 encoding nodes (e.g., encoding nodes 202 and 204) in the relaxation group and secondly on the level 1 nodes (e.g., encoding nodes 208 and 210). The encoding may include relaxation. For example, an XOR operation may be omitted between encoding nodes in the relaxation group in the same level. For example, a first XOR operation between encoding nodes 202 and 204 may be omitted, and a second XOR operation between encoding nodes 208 and 210 may be omitted. After relaxation is performed on encoding nodes in a given level, relaxation attributes for encoding nodes in the next level may be determined. For example, after relaxation is performed on encoding nodes 202 and 204, relaxation attributes may be determined for encoding nodes 208 and 210. The same attribute as the connected node of a previous level may be assigned, e.g. before reaching b. Encoding (e.g., including relaxation) may proceed before the final relaxation level is reached. For example, encoding may be performed on levels (e.g., each level) up to level b-1, inclusive.

Although the features and elements of the present invention are described in the preferred embodiments in particular combinations, each feature or element may be used alone without the other features and elements of the preferred embodiments or in various combinations with or without other features and elements of the present invention.

Although the solutions described herein consider New Radio (NR), 5G or LTE, LTE-A specific, tera bit or tera Hz communication protocols, it is understood that the solutions described herein are not restricted to this scenario and are applicable to other wireless systems as well.

What is claimed:

1. A wireless transmit/receive unit (WTRU) comprising:
a processor configured to:
determine a relaxation group based on relaxation attributes for each encoding node in a set of encoding nodes, wherein the relaxation group comprises a first encoding node associated with a first relaxation level and a first bit index and a second encoding node associated with the first relaxation level and a second bit index consecutive to the first bit index, and wherein the first encoding node and the second encoding node are associated with a first relaxation attribute;

determine a second relaxation level for the relaxation group;

perform relaxation associated with the relaxation group up to the second relaxation level; and send a transmission indicating complexity reduction information to a second WTRU.

2. The WTRU of claim 1, wherein the processor is further configured to:

determine a level of complexity reduction based on at least one parameter;

wherein the relaxation is performed based on the level of complexity reduction.

3. The WTRU of claim 2, further comprising obtaining the at least one parameter.

4. The WTRU of claim 3, wherein the at least one parameter is obtained by receiving, from at least one of a connecting network or the second WTRU, information indicating the at least one parameter.

5. The WTRU of claim 4, wherein the at least one parameter is received over a control channel.

6. The WTRU of claim 2, wherein the at least one parameter is one or more of a channel quality, a received signal power at the second WTRU, a battery status of the WTRU, a battery status of the second WTRU, a desired bit error rate, and a desired Quality of Service.

7. The WTRU of claim 1, wherein the set of encoding nodes are encoding nodes of a polar code.

8. The WTRU of claim 1, wherein the complexity reduction information enables the second WTRU to perform the relaxation associated with the relaxation group up to the second relaxation level.

9. A wireless transmit/receive unit (WTRU) comprising:
a processor configured to:
receive complexity reduction information; and
employ the complexity reduction information to:
determine a relaxation group based on relaxation attributes for each encoding node in a set of encoding nodes, wherein the relaxation group comprises a first encoding node associated with a first relaxation level and a first bit index and a second encoding node associated with the first relaxation level and a second bit index consecutive to the first bit index, and wherein the first encoding node and the second encoding node are associated with a first relaxation attribute;

determine a second relaxation level for the relaxation group; and perform relaxation associated with the relaxation group up to the second relaxation level.

10. The WTRU of claim 9, wherein the complexity reduction information is received from at least one of a connecting network or a second WTRU.

11. The WTRU of claim 10, wherein the complexity reduction information is received over a control channel.

12. The WTRU of claim 9, wherein the set of encoding nodes are encoding nodes of a polar code.

13. A method in a wireless transmit/receive unit (WTRU) comprising:

determining a relaxation group based on relaxation attributes for each encoding node in a set of encoding nodes, wherein the relaxation group comprises a first encoding node associated with a first relaxation level and a first bit index and a second encoding node associated with the first relaxation level and a second bit index consecutive to the first bit index, and wherein the first encoding node and the second encoding node are associated with a first relaxation attribute;

determining a second relaxation level for the relaxation group;

performing relaxation associated with the relaxation group up to the second relaxation level; and sending a transmission indicating complexity reduction information to a second WTRU.

14. The method of claim 13, further comprising:

determining a level of complexity reduction based on at least one parameter;

wherein the relaxation is performed based on the level of complexity reduction.

15. The method of claim 14, further comprising obtaining the at least one parameter.

16. The method of claim 15, wherein the at least one parameter is obtained by receiving, from at least one of a connecting network or the second WTRU, information indicating the at least one parameter.

17. The method of claim 16, wherein the at least one parameter is received over a control channel.

18. The method of claim 14, wherein the at least one parameter is one or more of a channel quality, a received signal power at the second WTRU, a battery status of the WTRU, a battery status of the second WTRU, a desired bit error rate, and a desired Quality of Service.

19. The method of claim 13, wherein the set of encoding nodes are encoding nodes of a polar code.

20. The method of claim 13, wherein the complexity reduction information enables the second WTRU to perform the relaxation associated with the relaxation group up to the second relaxation level.

* * * * *